US012581792B2

(12) United States Patent
Han et al.

(10) Patent No.: US 12,581,792 B2
(45) Date of Patent: Mar. 17, 2026

(54) ORGANIC LIGHT EMITTING DIODE AND ORGANIC LIGHT EMITTING DEVICE HAVING THEREOF

(71) Applicant: LG Display Co., Ltd., Seoul (KR)

(72) Inventors: Mi-Young Han, Paju-si (KR); Myeong-Seon Cho, Paju-si (KR); Nack-Youn Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 384 days.

(21) Appl. No.: 18/459,303

(22) Filed: Aug. 31, 2023

(65) Prior Publication Data

US 2024/0179933 A1 May 30, 2024

(30) Foreign Application Priority Data

Nov. 10, 2022 (KR) ........................ 10-2022-0149308

(51) Int. Cl.

| | |
|---|---|
| ***H10K 50/12*** | (2023.01) |
| ***H10K 50/125*** | (2023.01) |
| ***H10K 50/15*** | (2023.01) |
| *H10K 85/60* | (2023.01) |
| *H10K 101/00* | (2023.01) |
| *H10K 101/30* | (2023.01) |
| *H10K 101/40* | (2023.01) |

(52) U.S. Cl.

CPC ........... *H10K 50/12* (2023.02); *H10K 50/125* (2023.02); *H10K 50/15* (2023.02); *H10K 85/615* (2023.02); *H10K 85/631* (2023.02); *H10K 85/6572* (2023.02); *H10K 85/6574* (2023.02); *H10K 85/6576* (2023.02); *H10K 2101/30* (2023.02); *H10K 2101/40* (2023.02); *H10K 2101/90* (2023.02)

(58) Field of Classification Search

CPC ...... H10K 50/12; H10K 50/125; H10K 50/15; H10K 85/615; H10K 85/631; H10K 85/6572; H10K 85/6574; H10K 85/6576; H10K 2101/30; H10K 2101/40; H10K 2101/90; H10K 50/11; H10K 2101/10; H10K 59/12; H10K 50/13; C09K 11/06

See application file for complete search history.

(56) References Cited

U.S. PATENT DOCUMENTS 8,969,854 B2 * 3/2015 Takemura .............. H10K 50/11
257/89

* cited by examiner

*Primary Examiner* — Leonardo Andujar

(74) *Attorney, Agent, or Firm* — Seed Intellectual Property Law Group LLP

(57) ABSTRACT

The present disclosure relates to an organic light emitting diode (OLED) and an organic light emitting device having thereof. The OLED includes an emissive layer with at least one emitting part that includes a green emitting material layer including a first host and a green emitter and a charge control layer including a second host and a dopant of which a maximum luminescence wavelength peak range is longer than a maximum luminescence wavelength of the green emitter. The charge control layer enables the OLED to improve its luminous efficiency, extend its color gamut and maximize its luminous lifespan.

32 Claims, 11 Drawing Sheets

D3

ORGANIC LIGHT EMITTING DIODE AND ORGANIC LIGHT EMITTING DEVICE HAVING THEREOF

CROSS-REFERENCE TO RELATED APPLICATIONS

This application claims the benefit of and the priority of Korean Patent Application No. 10-2022-0149308, filed in the Republic of Korea on Nov. 10, 2022, which is expressly incorporated hereby in its entirety into the present application.

BACKGROUND

Technical Field

The present disclosure relates to an organic light emitting diode, and more particularly to, an organic light emitting diode that may have improved luminous efficiency and luminous lifespan and an organic light emitting device including thereof.

Description of the Related Art

A flat display device including an organic light emitting diode (OLED) has attracted attention as a display device that can replace a liquid crystal display device (LCD). The OLED can be formed as a thin organic film less than 2000 Å and the electrode configurations can implement unidirectional or bidirectional images. Also, the OLED can be formed even on a flexible transparent substrate such as a plastic substrate so that a flexible or a foldable display device can be realized with ease using the OLED. In addition, the OLED can be driven at a lower voltage and the OLED has advantageous high color purity compared to the LCD.

Since fluorescent material uses only singlet excitons in the luminous process, the related art fluorescent material shows low luminous efficiency. On the contrary, phosphorescent material can show high luminous efficiency since it uses triplet exciton as well as singlet excitons in the luminous process. However, examples of phosphorescent material include metal complexes, which have a short luminous lifespan for commercial use.

In addition, phosphorescent materials of high efficiency can be used for improving color gamut and luminance of the OLED. Since the efficiency and lifespan of the green phosphorescent materials in the OLED are trade-off, the luminous lifespan of the green phosphorescent material is reduced significantly as the efficiency of the material increases.

BRIEF SUMMARY

Inventors recognized that although the thickness of the emitting material layer including the green phosphorescent material can be increased to improve the luminous lifespan of the green phosphorescent material, the luminous lifespan of the material is barely improved, and the driving voltage of the OLED increase due to the increase in the thickness of the OLED. Embodiments of the present disclosure are directed to an organic light emitting diode and an organic light emitting device that substantially obviate one or more of the problems due to the limitations and disadvantages of the related art.

An aspect of the present disclosure provides an organic light emitting diode that has improved luminous efficiency and an organic light emitting device including the organic light emitting diode.

An aspect of the present disclosure provides an organic light emitting diode that has increased luminous lifespan and enhanced color gamut such as Color Reproduction Range and color overlapping ratio and an organic light emitting device including the diode.

Additional features and aspects will be set forth in the description that follows, and in part will be apparent from the description, or may be learned by practice of the disclosed concepts provided herein. Other features and aspects of the disclosed concept may be realized and attained by the structure particularly pointed out in the written description, or derivable therefrom, and the claims hereof as well as the appended drawings.

To achieve these and other advantages and in accordance with objects of the disclosure, as embodied and broadly described herein, in one aspect, the present disclosure provides an organic light emitting diode comprises a first electrode; a second electrode facing the first electrode; and an emissive layer disposed between the first and second electrode, and including at least one emitting part, wherein the at least one emitting part includes: a green emitting material layer including a first host and a green emitter; and a charge control layer disposed between the first electrode and the green emitting material layer, and including a second host and a dopant that has a maximum luminescence peak in a wavelength range longer than a maximum luminescence peak of the green emitter, and wherein the second host has a lowest unoccupied molecular orbital (LUMO) energy level lower than a LUMO energy level of the first host.

The second host can have a hole mobility three to ten times faster than a hole mobility of the first host.

The first host can include a carbazole-based organic compound.

The green emitter can include an organometallic compound that has a maximum luminescence peak in a green wavelength range.

The second host can include an aryl amine-based organic compound with a spirofluorene moiety or a hetero aryl amine-based organic compound with a spirofluorene moiety.

The dopant can include an organometallic compound that has a maximum luminescence peak in a red wavelength range or a yellow green wavelength range.

Contents of the dopant in the charge control layer can be between about 1 wt % and about 30 wt %.

As an example, the LUMO energy level of the second host and the LUMO energy level of the first host can satisfy the following relationship in Equation (1)

$$-0.3\ \text{eV} \leq \text{LUMO}^{CCL} - \text{LUMO}^{EML} < 0\ \text{eV} \quad (1)$$

wherein, in the Equation (1), $\text{LUMO}^{CCL}$ indicates a LUMO energy level of the second host and $\text{LUMO}^{EML}$ indicates a LUMO energy level of the first host.

Alternatively or additionally, the second host can have a highest occupied molecular orbital (HOMO) energy level equal to or higher than a HOMO energy level of the first host.

For example, the HOMO energy level of the second host and the HOMO energy level of the first host satisfy the following relationship in Equation (2):

$$0\ \text{eV} < \text{HOMO}^{CCL} - \text{HOMO}^{EML} \leq 0.3\ \text{eV} \quad (2)$$

wherein, in the Equation (2), $HOMO^{CCL}$ indicates a HOMO energy level of the second host and $HOMO^{EML}$ indicates a HOMO energy level of the first host.

The at least one emitting part can further include a hole transport layer disposed between the first electrode and the charge control layer.

The LUMO energy level of the second host can be equal to or higher than a LUMO energy level of a hole transporting material in the hole transport layer.

The LUMO energy level of the second host and the LUMO energy level of a hole transporting material in the hole transport layer can satisfy the following relationship in Equation (3):

$$0\ eV \leq LUMO^{CCL} - LUMO^{HTL} < 0.5\ eV \quad (3)$$

wherein, in the Equation (3), $LUMO^{CCL}$ indicates a LUMO energy level of the second host and $LUMO^{HTL}$ indicates a LUMO energy level of the hole transporting material.

Alternatively or additionally, a HOMO energy level of the second host can be equal to or higher than a HOMO energy level of a hole transporting material in the hole transport layer.

As an example, a HOMO energy level of the second host and a HOMO energy level of a hole transporting material in the hole transport layer satisfy the following relationship in Equation (4):

$$0\ eV < HOMO^{CCL} - HOMO^{HTL} \leq 0.3\ eV \quad (4)$$

wherein, in the Equation (4), $HOMO^{CCL}$ indicates a HOMO energy level of the second host and $HOMO^{HTL}$ indicates a HOMO energy level of the hole transporting material.

The second host can have a hole mobility ten to fifty times faster than a hole mobility of a hole transporting material in the hole transport layer.

In an example aspect, the emissive layer can have a single emitting part.

In an example aspect, the emissive layer can includes: a first emitting part disposed between the first and second electrodes; a second emitting part disposed between the first emitting part and the second electrode; and a first charge generation layer disposed between the first and second emitting parts, and wherein one of the first emitting part and the second emitting part includes the green emitting material layer and the charge control layer.

For example, the second emitting part can include the green emitting material layer and the charge control layer.

The second emitting part can include an emitting material layer disposed between the first charge generation layer and the second electrode, and wherein the emitting material layer includes: a first layer disposed between the charge control layer and the second electrode; and a second layer disposed between the first layer and the second electrode, and wherein one of the first layer and the second layer includes the green emitting material layer and the other of the first layer and the second layer includes a red emitting material layer.

The first emitting part can include a blue emitting material layer.

In an example aspect, the emissive layer includes: a first emitting part disposed between the first and second electrodes; a second emitting part disposed between the first emitting part and the second electrode; a third emitting part disposed between the second emitting part and the second electrode; a first charge generation layer disposed between the first and second emitting parts; and a second charge generation layer disposed between the second and third emitting parts, and wherein one of the first emitting part, the second emitting part and the third emitting part includes the green emitting material layer and the charge control layer.

As an example, each of the first emitting part and the third emitting part can include a blue emitting material layer.

In an example aspect, the emissive layer can include: a first emitting part disposed between the first and second electrodes; a second emitting part disposed between the first emitting part and the second electrode; a third emitting part disposed between the second emitting part and the second electrode; a fourth emitting part disposed between the third emitting part and the second electrode; a first charge generation layer disposed between the first and second emitting parts; a second charge generation layer disposed between the second and third emitting parts; and a third charge generation layer disposed between the third and fourth emitting parts, and wherein one of the first emitting part, the second emitting part, the third emitting part and the fourth emitting part includes the green emitting material layer and the charge control layer.

As an example, the third emitting part can include the green emitting material layer and the charge control layer.

The first emitting part can include a red emitting material layer.

Each of the second emitting part and the fourth emitting part includes a blue emitting material layer.

In yet an aspect, the present disclosure provides an organic light emitting device, for example, an organic light emitting display device or an organic light emitting illumination device that includes a substrate and the organic light emitting diode over the substrate.

The organic light emitting diode and the organic light emitting device includes the charge control layer disposed adjacently to the green emitting material layer and including a second host with adjusted energy level and a dopant having a maximum luminous peak in a longer wavelength range compared to the maximum luminous peak of the green emitter.

The second host in the charge control layer can have LUMO energy level equal to or lower than LUMO energy level of the first host and/or HOMO energy level equal to or higher than the HOMO energy level of the first host. Optionally, the second host can have hole mobility three to ten times faster than hole mobility of the first host and/or ten or more times faster than hole mobility of the hole transporting material in the hole transport layer disposed adjacently to the charge control layer.

Holes are not trapped in the charge control layer because the charge control layer has very fast hole mobility. Holes can be transferred to the green emitting material layer while the dopant in the charge control layer is not emitted substantially. It is possible to minimize the degradation of materials owing to hole trap and charge accumulation at the interface between the green emitting material layer and the charge control layer, to control hole transportation and injection into the green emitting material layer, and to prevent degradations of materials by holes.

Most of electrons injected to the green emitting material layer from the electron transport layer disposed oppositely to the charge control layer are trapped at the green emitter in the green emitting material layer and some of electrons are trapped in the charge control layer. It is possible to improve the stability of the hole transport layer because electrons are not injected to the hole transport layer. As the stability of the interface between the green emitting material layer and charge transport layer and/or charge control layer can be enhanced, the luminous lifespan of the organic light emitting diode can be improved.

Accordingly, the luminous efficiency such as current efficiency and/or external quantum efficiency of the diode can be improved. In addition, it is possible to minimize color purity degradation caused by yellow green dopant in a white organic light emitting diode, maximize the color gamut of Color Reproduction Range, and to improve the lifespan of the green light.

It is to be understood that both the foregoing general description and the following detailed description are merely by way of example and are intended to provide further explanation of the inventive concepts.

BRIEF DESCRIPTION OF THE SEVERAL VIEWS OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts.

The present disclosure relates to an organic light emitting diode and/or an organic light emitting device where a charge control layer disposed adjacently to a green emitting material layer and including a host with adjusted energy level and/or hole mobility and a dopant having maximum luminous peak in a wavelength range longer than maximum luminous peak of green emitter is introduced so as to improve luminous efficiency, luminous lifetime, color purity and/or color gamut thereof. The organic light emitting diode can be applied to an organic light emitting device such as an organic light emitting display device or an organic light emitting illumination device.

Figure 1:
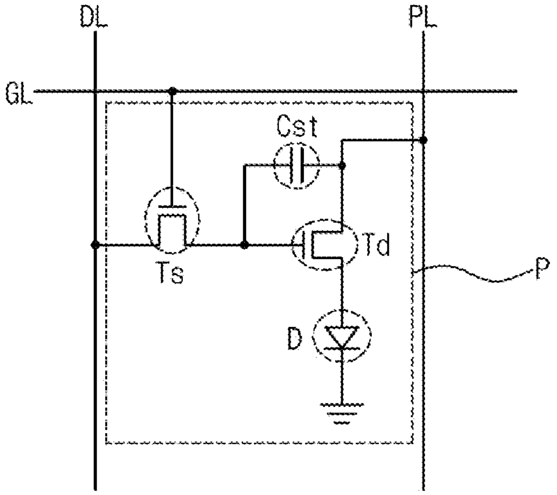
FIG. 1 illustrates a schematic circuit diagram of an organic light emitting display device in accordance with the present disclosure.

FIG. 1 illustrates a schematic circuit diagram of an organic light emitting display device in accordance with the present disclosure. As illustrated in FIG. 1, a gate line GL, a data line DL and power line PL, some of which cross each other at a pixel region P, in an organic light emitting display device 100. A switching thin film transistor Ts, a driving thin film transistor Td, a storage capacitor Cst and an organic light emitting diode D are disposed within the pixel region P. The pixel region P may include a red (R) pixel region, a green (G) pixel region and a blue (B) pixel region. However, embodiments of the present disclosure are not limited to such examples.

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to the gate electrode 130 (FIG. 2) so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
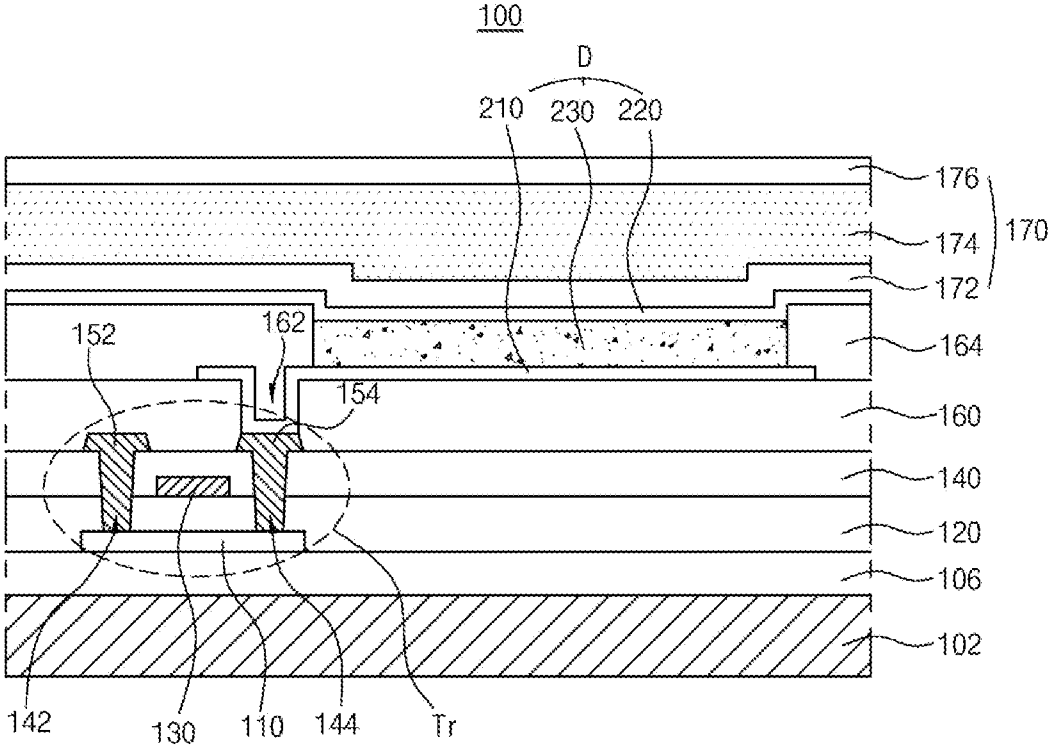
FIG. 2 illustrates a cross-sectional view of an organic light emitting display device as an example of an organic light emitting device in accordance with an example embodiment of the present disclosure.

FIG. 2 illustrates a schematic cross-sectional view of an organic light emitting display device in accordance with an example embodiment of the present disclosure. As illustrated in FIG. 2, the organic light emitting display device 100 includes a substrate 102, a thin-film transistor Tr on the substrate 102, and an organic light emitting diode D connected to the thin film transistor Tr. As an example, the substrate 102 can include a red pixel region, a green pixel region and a blue pixel region and an organic light emitting diode D can be located in each pixel region. Each of the organic light emitting diodes D emitting red, green and blue light, respectively, is located correspondingly in the red pixel region, the green pixel region and the blue pixel region.

The substrate 102 can include, but is not limited to, glass, thin flexible material and/or polymer plastics. For example, the flexible material can be selected from the group, but is not limited to, polyimide (PI), polyethersulfone (PES), polyethylenenaphthalate (PEN), polyethylene terephthalate (PET), polycarbonate (PC) and/or combinations thereof. The substrate 102, on which the thin film transistor Tr and the organic light emitting diode D are arranged, forms an array substrate.

A buffer layer 106 can be disposed on the substrate 102. The thin film transistor Tr can be disposed on the buffer layer 106. The buffer layer 106 can be omitted.

A semiconductor layer 110 is disposed on the buffer layer 106. In an example embodiment, the semiconductor layer 110 can include, but is not limited to, oxide semiconductor materials. In this case, a light-shield pattern may be disposed under the semiconductor layer 110, and the light-shield pattern can prevent light from being incident toward the semiconductor layer 110, and thereby, preventing or reducing the semiconductor layer 110 from being degraded by the light. Alternatively or additionally, the semiconductor layer 110 can include polycrystalline silicon. In this case, opposite edges of the semiconductor layer 110 can be doped with impurities.

A gate insulating layer 120 including an insulating material is disposed on the semiconductor layer 110. The gate insulating layer 120 can include, but is not limited to, an inorganic insulating material such as silicon oxide ($SiO_x$, wherein $0<x\leq 2$) or silicon nitride ($SiN_x$, wherein $0<x\leq 2$).

A gate electrode 130 made of a conductive material such as a metal is disposed on the gate insulating layer 120 so as to correspond to a center of the semiconductor layer 110. While the gate insulating layer 120 is disposed on a whole area of the substrate 102 as shown in FIG. 2, the gate insulating layer 120 may be patterned identically as the gate electrode 130.

An interlayer insulating layer 140 including an insulating material is disposed on the gate electrode 130 and covers an entire surface of the substrate 102. The interlayer insulating layer 140 can include, but is not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose or do not cover a portion of the surface nearer to the opposing ends than to a center of the semiconductor layer 110. The first and second semiconductor layer contact holes 142 and 144 are disposed on opposite sides of the gate electrode 130 and spaced apart from the gate electrode 130. The first and second semiconductor layer contact holes 142 and 144 are formed within the gate insulating layer 120 in FIG. 2. Alternatively or additionally, the first and second semiconductor layer contact holes 142 and 144 can be formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other on opposing sides of the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed on the semiconductor layer 110. Alternatively or additionally, the thin film transistor Tr can have an inverted staggered structure in which a gate electrode is disposed under a semiconductor layer and a source and drain electrodes are disposed on the semiconductor layer. In this case, the semiconductor layer can include amorphous silicon.

The gate line GL and the data line DL, which cross each other at a pixel region P, and a switching element Ts, which is connected to the gate line GL and the data line DL, can be further formed in the pixel region P. The switching element Ts is connected to the thin film transistor Tr, which is a driving element. In addition, the power line PL is spaced apart in parallel from the gate line GL or the data line DL. The thin film transistor Tr may further include a storage capacitor Cst configured to constantly keep a voltage of the gate electrode 130 for one frame.

A passivation layer 160 is disposed on the source and drain electrodes 152 and 154. The passivation layer 160 covers the thin film transistor Tr on the whole substrate 102. The passivation layer 160 has a flat top surface and a drain contact hole 162 that exposes or does not cover the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is disposed in each pixel region. The first electrode 210 can be an anode and include conductive material having relatively high work function value. For example, the first electrode 210 can include a transparent conductive oxide (TCO). For example, the first electrode 210 can include, but is not limited to, indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or combinations thereof.

In an example embodiment, when the organic light emitting display device 100 is a bottom-emission type, the first electrode 210 can have a single-layered structure of the TCO. Alternatively or additionally, when the organic light emitting display device 100 is a top-emission type, a reflective electrode or a reflective layer may be disposed under the first electrode 210. For example, the reflective electrode or the reflective layer can include, but is not limited to, silver (Ag) or aluminum-palladium-copper (APC) alloy. In the OLED D of the top-emission type, the first electrode 210 can have a triple-layered structure of ITO/Ag/ITO or ITO/APC/ITO.

In addition, a bank layer 164 is disposed on the passivation layer 160 in order to cover edges of the first electrode 210. The bank layer 164 exposes or does not cover a center of the first electrode 210 corresponding to each pixel region. The bank layer 164 may be omitted.

An emissive layer 230 is disposed on the first electrode 210. In an example embodiment, the emissive layer 230 can have a single-layered structure of an emitting material layer (EML). Alternatively or additionally, the emissive layer 230 can have a multiple-layered structure of a hole injection layer (HIL), a hole transport layer (HTL), an electron blocking layer (EBL), an EML, a hole blocking layer (HBL), an electron transport layer (ETL), an electron injection layer (EIL) and/or a charge generation layer (CGL) (FIG. 3 and FIGS. 6 to 8). In one aspect, the emissive layer 230 can have a single emitting part. Alternatively or additionally, the emissive layer 230 can have multiple emitting parts to form a tandem structure.

The second electrode 220 is disposed on the substrate 102 above which the emissive layer 230 is disposed. The second electrode 220 can be disposed on a whole display area. The second electrode 220 can include a conductive material with a relatively low work function value compared to the first electrode 210. The second electrode 220 can be a cathode providing electrons. For example, the second electrode 220 can include at least one of, but is not limited to, aluminum (Al), magnesium (Mg), calcium (Ca), silver (Ag), alloy thereof and/or combinations thereof such as aluminum-magnesium alloy (Al—Mg). When the organic light emitting display device 100 is a top-emission type, the second electrode 220 is thin so as to have light-transmissive (semi-transmissive) property.

In addition, an encapsulation film 170 can be disposed on the second electrode 220 in order to prevent or reduce outer moisture from penetrating into the OLED D. The encapsulation film 170 can have, but is not limited to, a laminated structure of a first inorganic insulating film 172, an organic insulating film 174 and a second inorganic insulating film 176. The encapsulation film 170 can be omitted.

A polarizing plate can be attached onto the encapsulation film 170 to reduce reflection of external light. For example, the polarizing plate may be a circular polarizing plate. When the organic light emitting display device 100 is a bottom-emission type, the polarizing plate can be disposed under the substrate 102. Alternatively or additionally, when the organic light emitting display device 100 is a top-emission type, the polarizing plate can be disposed on the encapsulation film 170. In addition, a cover window can be attached to the encapsulation film 170 or the polarizing plate. In this case, the substrate 102 and the cover window may have a flexible property, thus the organic light emitting display device 100 may be a flexible display device.

Figure 3:
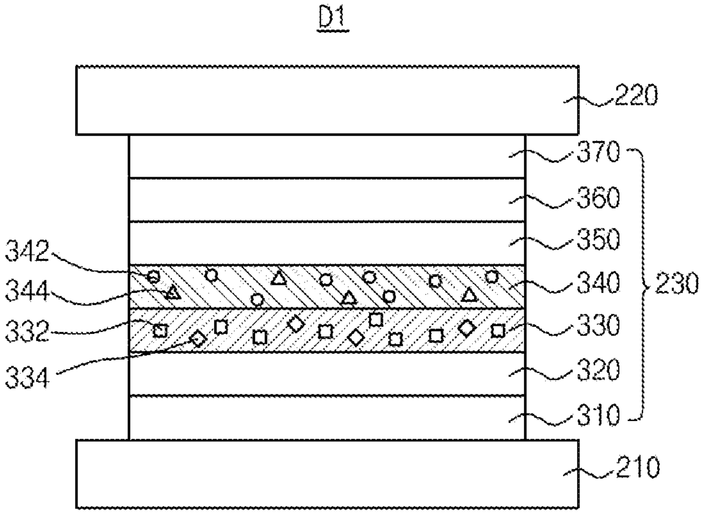
FIG. 3 illustrates a cross-sectional view of an organic light emitting diode having a single emitting part in accordance with an example embodiment of the present disclosure.
Figure 4:
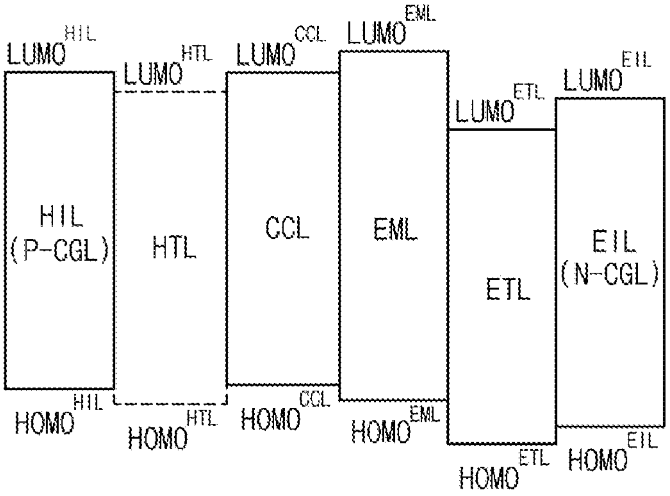
FIG. 4 illustrates a schematic diagram showing energy levels of an emissive layer in an emitting part including a charge control layer.

The OLED D is described in more detail. FIG. 3 illustrates a schematic cross-sectional view of an organic light emitting diode having a single emitting part in accordance with an example embodiment of the present disclosure. FIG. 4 illustrates a schematic diagram showing energy levels of an emissive layer in an emitting part including a charge control layer.

As illustrated in FIG. 3, the organic light emitting diode (OLED) D1 in accordance with the present disclosure includes first and second electrodes 210 and 220 facing each other and an emissive layer 230 disposed between the first and second electrodes 210 and 220. The organic light emitting display device 100 includes a red pixel region, a green pixel region and a blue pixel region, and the OLED D1 can be disposed in the green pixel region.

In an example embodiment, the emissive layer 230 includes an emitting material layer (EML) 340 disposed between the first and second electrodes 210 and 220. The emissive layer 230 includes a charge control layer (CCL) 330 disposed between the first electrode 210 and the EML 340. Also, the emissive layer 230 can include at least one of an HTL 320 disposed between the first electrode 210 and the EML 340 and an ETL 360 disposed between the second electrode 220 and the EML 340. In addition, the emissive layer 230 can further include at least one of an HIL 310 disposed between the first electrode 210 and the HTL 320 and an EIL 370 disposed between the second electrode 220 and the ETL 360. Alternatively or additionally, the emissive layer 230 can further comprise a first exciton blocking layer, i.e., an EBL disposed between the HTL 320 and the EML 340 and/or a second exciton blocking layer, i.e., an HBL 350 disposed between the EML 340 and the ETL 360.

The first electrode 210 can be an anode that provides a hole into the EML 340. The first electrode 210 can include a conductive material having a relatively high work function value, for example, a transparent conductive oxide (TCO). In an example embodiment, the first electrode 210 can include, but is not limited to, ITO, IZO, ITZO, SnO, ZnO, ICO, AZO, and/or combinations thereof.

The second electrode 220 can be a cathode that provides an electron into the EML 340. The second electrode 220 can include a conductive material having a relatively low work function values, i.e., a highly reflective material such as Al, Mg, Ca, Ag, and/or alloy thereof and/or combinations thereof such as Al—Mg. For example, each of the first electrode 210 and the second electrode 220 can have, but is not limited to, a thickness of about 10 nm to about 300 nm.

The HIL 310 is disposed between the first electrode 210 and the HTL 320 and can improve an interface property between the inorganic first electrode 210 and the organic HTL 320. In an example embodiment, the HIL 310 can include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), N,N'-Bis{4-[bis(3-methylphenyl)amino]phenyl}-N,N'-diphenyl-4,4'-biphenyldiamine (DNTPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino) phenyl]benzidine (NPNPB), $MgF_2$, $CaF_2$ and/or combinations thereof.

In an embodiment, the HIL 310 can include a host of the above hole injecting material and/or hole transporting material below, and a P-type dopant. As an example, the host in the HIL 310 can be an aryl amine-based compound with a spirofluorene moiety, a hetero aryl amine-based compound with a spirofluorene moiety and/or combinations thereof as identical to a second host 332 in the CCL 330 which will be described in more detail.

The P-type dopant can include, but is not limited to, HAT-CN, 2,3,5,6-tetrafluoro-7,7,8,8-tetracyanoquinodimethane (F4-TCNQ), 1,3,4,5,7,8-hexafluorotetracyanonaphthoquinodimethane (F6-TCNNQ), NPD9 and/or combinations thereof. The contents of the P-type dopant in the HIL 310 can be, but is not limited to, about 1 wt % to about 10 wt %. As an example, the HIL 310 can have a thickness of, but is not limited to, about 1 to about 100 nm. The HIL 310 can be omitted in compliance of the OLED D1 property.

The HTL 320 is disposed between the first electrode 210 and the EML 340. In an example embodiment, the HTL 320 can include, but is not limited to, N,N'-Diphenyl-N,N'-bis (3-methylphenyl)-1,1'-biphenyl-4,4'-diamine (TPD), NPB (NPD), DNTPD, N4,N4,N4',N4-Tetra[(1,1'-biphenyl)-4-yl]-(1,1'-biphenyl)-4,4'-diamine (BPBPA), 4,4'-bis(N-carbazolyl)-1,1'-biphenyl (CBP), Poly[N,N'-bis(4-butylpnehylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)-phenyl]cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine), N-([1,1'-Biphenyl]-4-yl)-9,9-dimethyl-N-(4-(9-phenyl-9H-carbazol-3-yl)phenyl)-9H-fluoren-2-amine and/or combinations thereof.

Alternatively or additionally, the HTL 320 can include, but is not limited to, an aryl amine-based compound with a spirofluorene moiety, a hetero aryl amine-based compound with a spirofluorene moiety and/or combinations thereof as identical to a second host 332 in the CCL 330. As an example, the HTL 320 can have a thickness of, but is not limited to, about 20 nm to about 200 nm. The HTL 320 can be omitted.

The EML 340 can be a green EML including a first host 342 and a green emitter 344. For example, the first host 342 can be a P-type host (hole-type host). Alternatively or additionally, the first host 342 can include the P-type host and an N-type host (electron-type host).

For example, the first host 342 of the P-type host can be a carbazole-based organic compound with a carbazole moiety and an unsubstituted or substituted fused aromatic or hetero aromatic moiety. For example, the first host 342 of the P-type host can include a biscarbazole-based organic compound. The first host 342 of the N-type host can include, but is not limited to, an azine-based organic compound.

Alternatively or additionally, the first host 342 of the P-type host can include, but is not limited to, 9-(3-(9H-carbazol-9-yl)phenyl)-9H-carbazole-3-carbonitrile (mCP-CN), CBP, 3,3-Di(9H-carbazol-9-yl)biphenyl (mCBP), 1,3-Bis(carbazol-9-yl)benzene (mCP), Bis[2-(diphenylphosphino)phenyl]ether oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3,5'-Di(carbazol-9-yl)-[1,1'-biphenyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilyl-phenylphosphine oxide (TSPO1), 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole, 9,9'-Diphenyl-9H,9'H-3,3'-bicarbazole (BCzPh), 1,3,5-Tris(carbazol-9-yl)benzene (TCP), TCTA, 4,4'-Bis(carbazole-9-yl)-2,2'-dimethylbiphenyl (CDBP), 2,7-Bis(carbazole-9-yl)-9,9-dimethylfluorene (DMFL-CBP), 2,2',7,7'-Tetrakis(carbazol-9-yl)-9,9-spirofluorene (Spiro-CBP), 3,6-Bis(carbazole-9-yl)-9-(2-ethyl-hexyl)-9H-carbazole (TCz1), BPBPA, 1,3,5-Tris(N-phenylbenzimidazol-2-yl)benzene (TBPi) and/or combinations thereof.

The green emitter 344 can include at least one of a green phosphorescent material of a green organometallic compound, a green fluorescent material and a green delayed fluorescent material each of which has maximum luminescence peak in a green wavelength range. As an example, the green emitter 344 can be, but is not limited to, a green phosphorescent material such as organometallic compound having maximum luminescence peak in a wavelength range between about 530 nm and about 540 nm.

For example, the green emitter 344 can include, but is not limited to, [Bis(2-phenylpyridine)](pyridyl-2-benzofuro[2,3-b]pyridine)iridium, Tris[2-phenylpyridine]iridium (III) (Ir$(ppy)_3$), fac-Tris(2-phenylpyridine)iridium (III) (fac-Ir$(ppy)_3$), Bis(2-phenylpyridine)(acetylacetonate)iridium (III) (Ir$(ppy)_2$(acac)), Tris[2-(p-tolyl)pyridine]iridium (III) (Ir$(mppy)_3$), Bis(2-(naphthalene-2-yl)pyridine)(acetylacetonate)iridium (III) (Ir$(npy)_2$acac), Tris(2-phenyl-3-methyl-pyridine)iridium (Ir$(3mppy)_3$), fac-Tris(2-(3-p-xylyl)phenyl)pyridine iridium (III) (TEG) and/or combinations thereof.

The contents of the first host 342 including the P-type host, and optionally the N-type host in the EML 340 can be about 50 wt % to about 99 wt %, for example, about 80 wt % to about 95 wt %, and the contents of the green emitter 344 in the EML 340 can be about 1 wt % to about 50 wt %, for example, about 5 wt % to about 20 wt %, but is not limited thereto. When the EML 340 includes both the P-type host and the N-type host, the P-type host and the N-type host can be admixed, but is not limited to, with a weight ratio of about 4:1 to about 1:4, for example about 3:1 to about 1:3. As an example, the EML 340 can have a thickness, but is not limited to, about 10 nm to about 200 nm.

The OLED D1 includes the CCL 330 disposed between the first electrode 210 or the HTL 320 and the green EML 340. The CCL 330 includes a second host 332 and a dopant 334. The second host 332 can be an aryl amine-based organic compound with a spirofluorene moiety and/or a hetero aryl amine-based organic compound with a spirofluorene moiety. For example, the second host 332 can be an organic compound having the following structure of Chemical Formula 1:

[Chemical Formula 1]

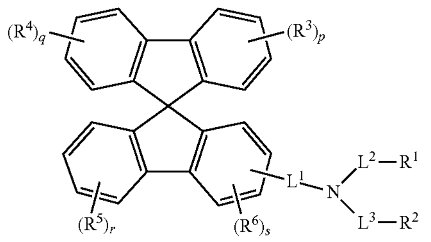

where in the Chemical Formula 1, each of $R^1$ and $R^2$ is independently an unsubstituted or substituted $C_6$-$C_{30}$ aryl or an unsubstituted or substituted $C_3$-$C_{30}$ hetero aryl, wherein at least one of $R^1$ and $R^2$ is polycyclic aryl or polycyclic hetero aryl, optionally, each of the unsubstituted or substituted $C_6$-$C_{30}$ aryl and the unsubstituted or substituted $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring;

each of $R^3$ to $R^6$ is independently an unsubstituted or substituted $C_1$-$C_{20}$ alkyl or an unsubstituted or substituted $C_6$-$C_{30}$ aryl, wherein each $R^3$ is identical to or different from each other when p is 2, 3 or 4, each $R^4$ is identical to or different from each other when q is 2, 3 or 4, each $R^5$ is identical to or different from each other when r is 2, 3 or 4, and each $R^6$ is identical to or different from each other when s is 2 or 3;

each of $L^1$ to $L^3$ is independently a single bond, an unsubstituted or substituted $C_6$-$C_{30}$ arylene or an unsubstituted or substituted $C_3$-$C_{30}$ hetero arylene, optionally, each of the unsubstituted or substituted $C_6$-$C_{30}$ arylene and the unsubstituted or substituted $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of p, q and r is independently 0, 1, 2, 3 or 4; and s is 0, 1, 2 or 3.

As used herein, the term "unsubstituted" means that hydrogen is directly linked to a carbon atom. "Hydrogen," as used herein, may refer to protium, deuterium and tritium.

As used herein, "substituted" means that the hydrogen is replaced with a substituent. The substituent can comprise, but is not limited to, an unsubstituted or halogen-substituted $C_1$-$C_{20}$ alkyl group, an unsubstituted or halogen-substituted $C_1$-$C_{20}$ alkoxy, halogen, a cyano group, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a nitro group, a hydrazyl group, a sulfonate group, a $C_1$-$C_{10}$ alkyl silyl group, a $C_1$-$C_{10}$ alkoxy silyl group, a $C_3$-$C_{20}$ cyclo alkyl silyl group, a $C_6$-$C_{30}$ aryl silyl group, a $C_3$-$C_{30}$ hetero aryl silyl group, an unsubstituted or substituted $C_6$-$C_{30}$ aryl group, an unsubstituted or substituted $C_3$-$C_{30}$ hetero aryl group.

As used herein, the term "hetero" in terms such as "a hetero aryl group," and "a hetero arylene group" and the likes means that at least one carbon atom, for example 1 to 5 carbons atoms, constituting an aliphatic chain, an alicyclic group or ring or an aromatic group or ring is substituted with at least one hetero atom selected from the group consisting of N, O, S and P.

The aryl group can independently include, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl or spiro-fluorenyl.

The hetero aryl group can independently include, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl.

In an example embodiment, each of the $C_6$-$C_{30}$ aryl and the $C_3$-$C_{30}$ hetero aryl of $R^1$ to $R^6$ and/or each of the $C_6$-$C_{30}$ arylene and the $C_3$-$C_{30}$ hetero arylene of $L^1$ to $L^3$ in Chemical Formula 1 can be independently unsubstituted or substituted with at least one of $C_1$-$C_{10}$ alkyl, $C_6$-$C_{20}$ aryl and $C_3$-$C_{20}$ hetero aryl, or form a spiro structure with a $C_6$-$C_{20}$ aromatic ring or a $C_3$-$C_{20}$ hetero aromatic ring.

As an example, the aromatic amino or the hetero aromatic amino may be linked to, but is not limited to, 2'-position or 4'-position of the spiro-bifluorene moiety directly or via the bridging group $L^1$. In an example embodiment, the polycyclic aryl and the polycyclic hetero aryl, which may be one of $R^1$ and $R^2$ in Chemical Formula 1, can include, but is not limited to, fluorenyl, dibenzofuranyl, dibenzothiophenyl, carbazolyl and naphthyl (e.g., 2-naphthyl) each of which may be independently unsubstituted or substituted with at least one of $C_1$-$C_{10}$ alkyl, $C_6$-$C_{20}$ aryl and $C_3$-$C_{20}$ hetero aryl, or may form a spiro structure with an unsubstituted or substituted $C_6$-$C_{20}$ aromatic ring or unsubstituted or substituted $C_3$-$C_{20}$ hetero aromatic ring.

Alternatively or additionally, each of $L^1$ to $L^3$ in Chemical Formula 1 can be, but is not limited to, independently a single bond or unsubstituted or substituted phenylene. In an example embodiment, the second host 332 can include at least one of, or can be selected from, but is not limited to, the following organic compounds of Chemical Formula 2:

[Chemical Formula 2]

H1

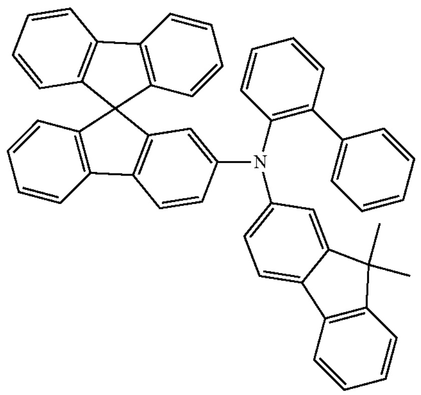

H2

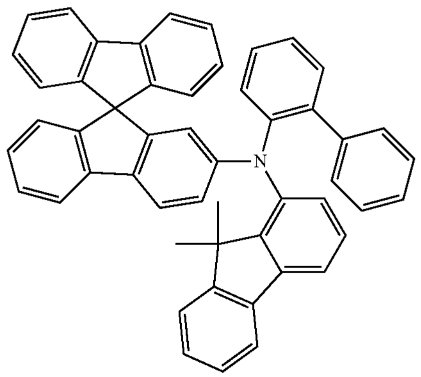

H3

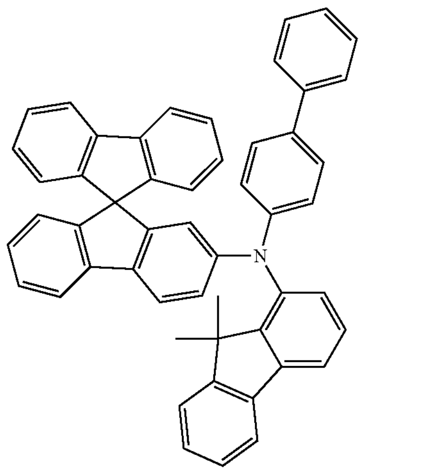

-continued
H4
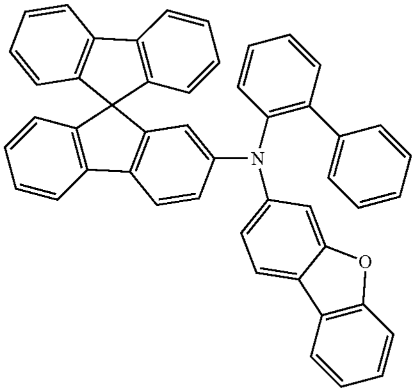
H5
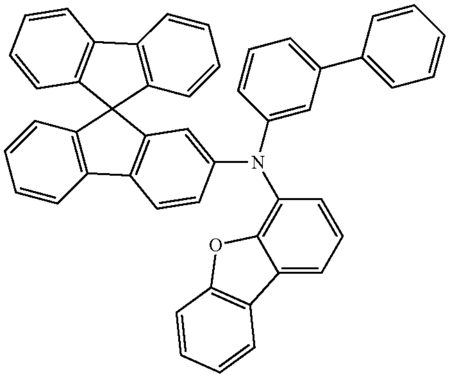
H6
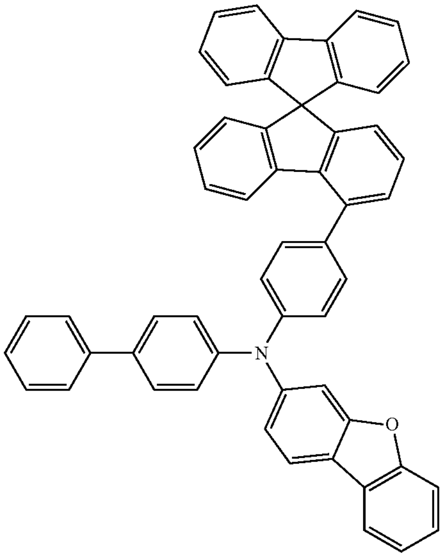
-continued
H7
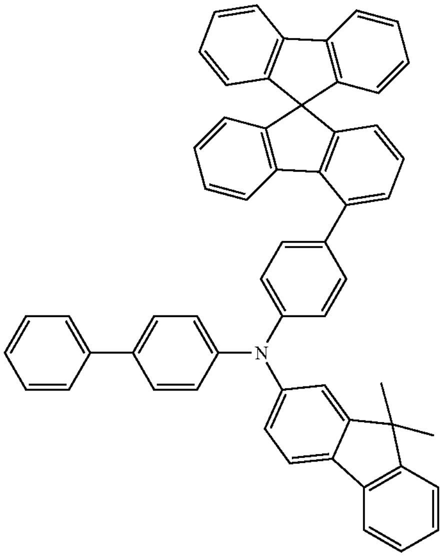
H8
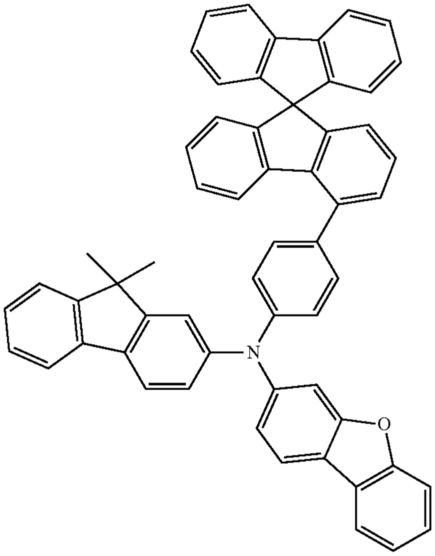

-continued
H9
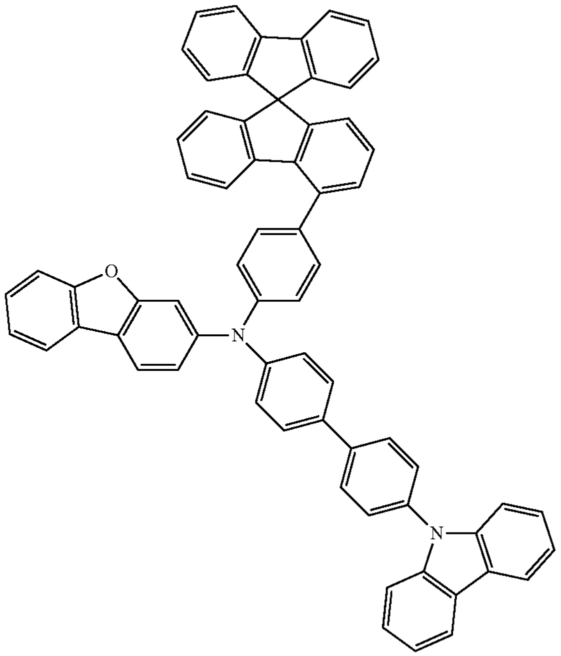
H10
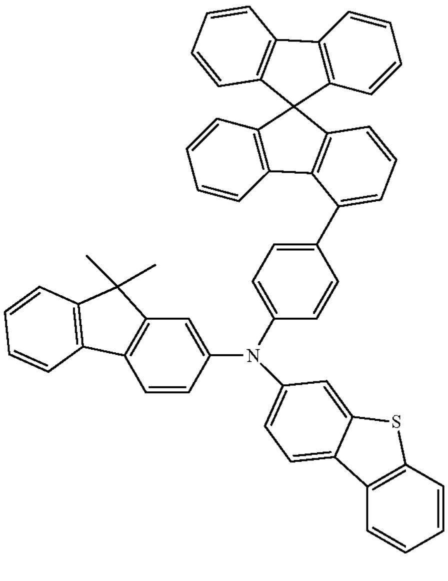
-continued
H11
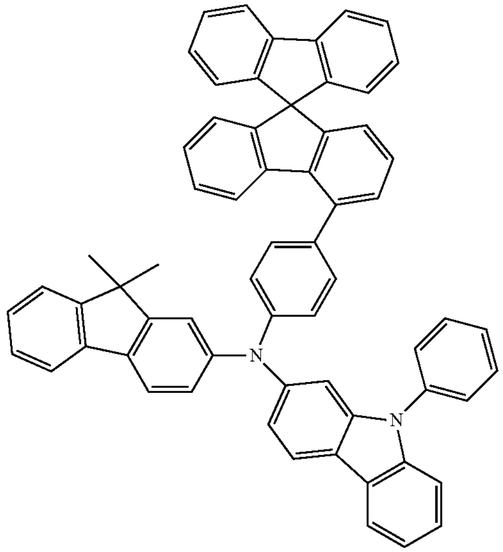
H12
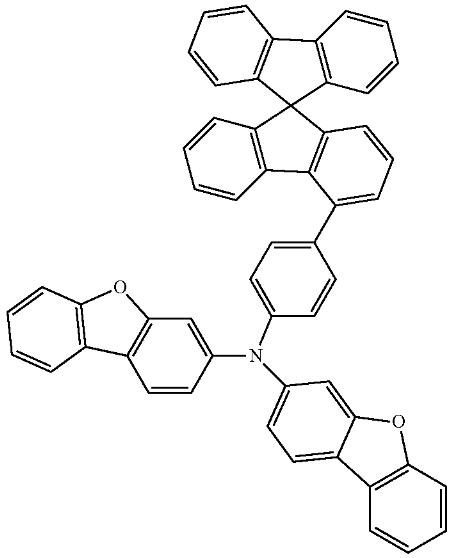
H13
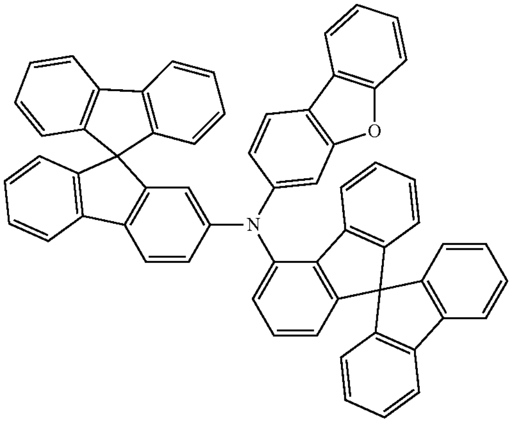

-continued
H14
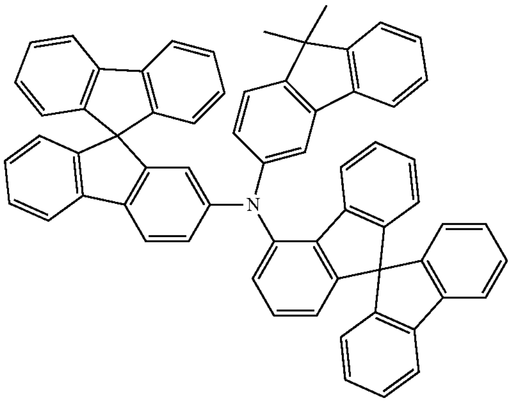
H15
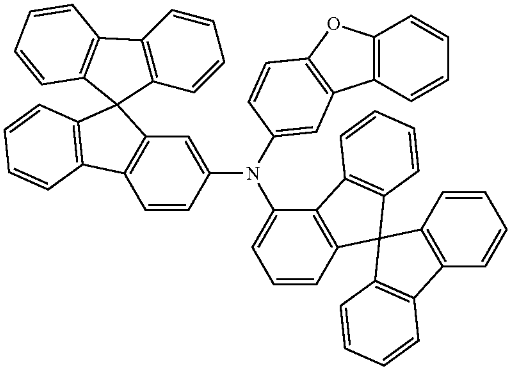
H16
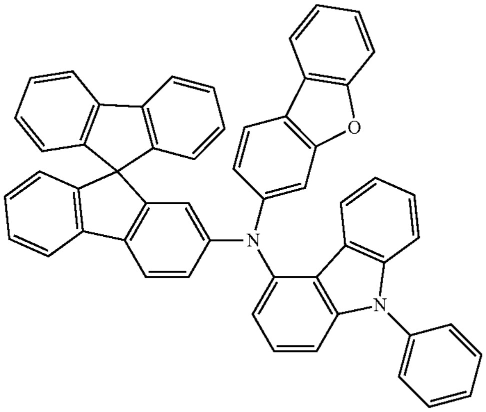
-continued
H17
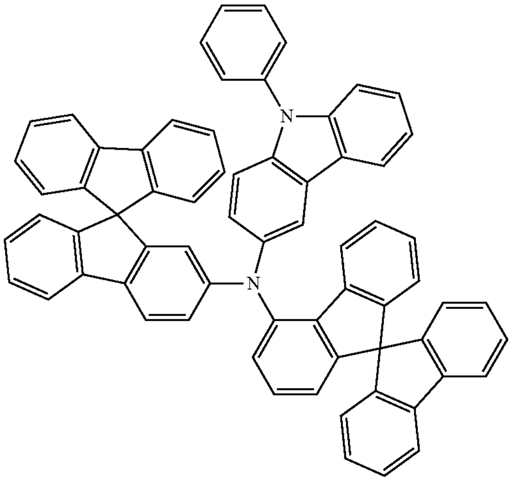
H18
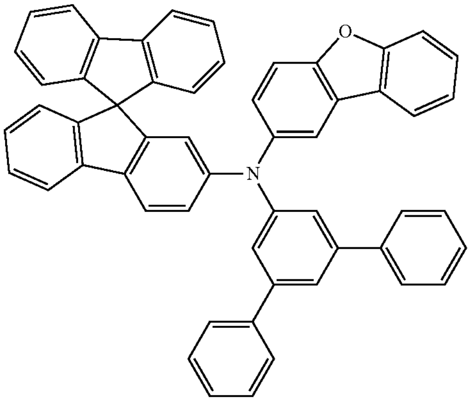
H19
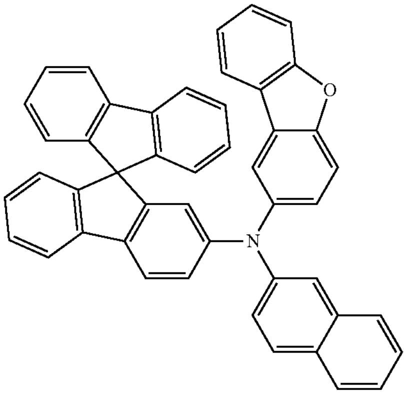

-continued

H20

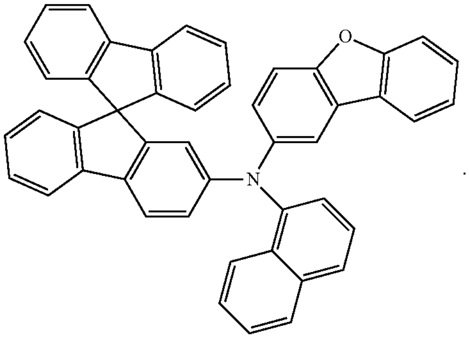

The dopant 334 in the CCL 330 can be any phosphorescent material, fluorescent material and/or delayed fluorescent material that has maximum luminescence peak in a wavelength range longer than a maximum luminesce peak of the green emitter 344. That is the wavelength range of the maximum luminescence peak of dopant 334 does not overlap with the maximum luminesce peak of the green emitter 344. In an example embodiment, the dopant 334 can include, but is not limited to, phosphorescent material of an organometallic compound having maximum luminescence peak in the wavelength range between about 555 nm and about 630 nm. Alternatively or additionally, the dopant 334 can be a yellow-green dopant having maximum luminescence peak in the range between about 552 nm and about 568 nm and/or a red dopant having maximum luminescence peak in the wavelength range between about 600 nm and about 630 nm, for example, about 612 nm and about 624 nm.

The yellow-green dopant includes yellow-green phosphorescent material, yellow-green fluorescent material and/or yellow-green delayed fluorescent material each which has maximum luminescence peak in the yellow-green wavelength ranges. As an example, the yellow-green dopant can include, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetylacetonate)iridium(III) ($Ir(BT)_2(acac)$), Bis(2-(9,9-diethyl-fluoren-2-yl)-1-phenyl-1H-benzo[d] imdiazolato)(acetylacetonate) iridium (III) ($Ir(fbi)_2(acac)$), Bis(2-phenylpyridine)(3-(pyridine-2-yl)-2H-chromen-2-onate) iridium (III) (fac-$Ir(ppy)_2Pc$), Bis(2-(2,4-difluorophenyl)quinoline)(picolinate) iridium (III) (FPQIrpic), Bis (4-phenylthieno[3,2-c]pyridinato-N,C2') (acetylacetonate) iridium (III) (PO-01) and/or combinations thereof.

The red dopant includes red phosphorescent material, red fluorescent material and/or red delayed fluorescent material each which has maximum luminescence peak in the red wavelength ranges. As an example, the red dopant can include, but is not limited to, Bis[2-(4,6-dimethyl)phenylquinoline)](2,2,6,6-tetramethylheptane-3,5-dionate) iridium (III), Bis[2-(4-n-hexylphenyl)quinoline](acetylacetonate) iridium (III) (Hex-$Ir(phq)_2(acac)$), Tris[2-(4-n-hexylphenyl)quinoline] iridium (III) (Hex-$Ir(phq)_3$), Tris[2-phenyl-4-methylquinoline] iridium (III) ($Ir(Mphq)_3$), Bis(2-phenylquinoline)(2,2,6,6-tetramethylheptane-3,5-dionate) iridium (III) ($Ir(dpm)PQ_2$), Bis(phenylisoquinoline)(2,2,6,6-tetramethylheptane-3,5-dionate) iridium (III) ($Ir(dpm)(piq)_2$), Bis(1-phenylisoquinoline)(acetylacetonate) iridium (III) ($Ir(piq)_2(acac)$), Bis[(4-n-hexylphenyl)isoquinoline](acetylacetonate) iridium (III) (Hex-$Ir(piq)_2(acac)$), Tris[2-(4-n-hexylphenyl)quinoline] iridium (III) (Hex-$Ir(piq)_3$), Tris(2-(3-methylphenyl)-7-methyl-quinolato) iridium ($Ir(dmpq)_3$), Bis[2-(2-methylphenyl)-7-methyl-quinoline](acetylacetonate) iridium (III) ($Ir(dmpq)_2(acac)$), Bis[2-(3,5-dimethylphenyl)-4-methyl-quinoline](acetylacetonate) iridium (III) ($Ir(mphmq)_2(acac)$), Tris(dibenzoylmethane)mono(1,10-phenanthroline)europium (III) ($Eu(dbm)_3(phen)$) and/or combinations thereof.

The contents of the second host 332 in the CCL 330 can be about 70 wt % to about 99 wt %, for example, about 80 wt % to about 95 wt %, and the contents of the dopant 334 in the CCL 330 can be about 1 wt % to about 30 wt %, for example, about 5 wt % to about 20 wt %, but is not limited thereto. As an example, the CCL 330 can have a thickness, but is not limited to, about 10 nm to about 100 nm, for example, about 5 nm to about 30 nm.

The ETL 360 and the EIL 370 can be laminated sequentially between the EML 340 and the second electrode 220. An electron transporting material included in the ETL 360 has high electron mobility so as to provide electrons stably with the EML 340 by fast electron transportation.

The ETL 360 combines efficiently electrons transported from the second electrode 220 through the EIL 370 and injects electrons rapidly to the EML 340. As an example, the ETL 360 can include at least one of an oxadiazole-based compound, a triazole-based compound, a phenanthroline-based compound, a benzoxazole-based compound, a benzothiazole-based compound, a benzimidazole-based compound, and a triazine-based compound.

For example, the ETL 360 can include, but is not limited to, tris-(8-hydroxyquinoline aluminum) ($Alq_3$), 2-biphenyl-4-yl-5-(4-t-butylphenyl)-1,3,4-oxadiazole (PBD), spiro-PBD, lithium quinolate (Liq), 2,2', 2"-(1,3,5-benzenetriyl)-tris(1-phenyl-1-H-benzimidazole) (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis (naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline) (TPQ), TSPO1, 2-[4-(9,10-Di-2-naphthalen-2-yl-2-anthracen-2-yl) phenyl]-1-phenyl-1H-benzimidazole (ZADN) and/or combinations thereof.

The EIL 370 is disposed between the second electrode 220 and the ETL 360, and can improve physical properties of the second electrode 220 and therefore, can enhance the lifespan of the OLED D1. In an example embodiment, the EIL 370 can include, but is not limited to, an alkali metal halide and/or an alkaline earth metal halide such as LiF, CsF, NaF, $BaF_2$ and the like, and/or an organometallic compound such as Liq, lithium benzoate, sodium stearate, and the like.

As an example, each of the ETL 360 and the EIL 370 can have a thickness of, but is not limited to, about 1 nm to about 100 nm. Alternatively or additionally, the EIL 370 can be omitted.

When holes are transferred to the second electrode 220 via the EML 340, the OLED D1 may have short lifespan and reduced luminous efficiency. In order to prevent those phenomena, the OLED D1 in accordance with this aspect of the present disclosure can further include the HBL 350 between the EML 340 and the ETL 360 so that holes cannot be transferred from the EML 340 to the ETL 360. In an example embodiment, the HBL 350 can include, but is not limited to, at least one of an oxadiazole-based compound, a triazole-based compound, a phenanthroline-based compound, a benzoxazole-based compound, a benzothiazole-based compound, a benzimidazole-based compound, and a triazine-based compound.

For example, the HBL 350 can include material having a relatively low HOMO energy level compared to the luminescent materials in EML 340. The HBL 350 can include, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole, TSPO1 and/or combinations thereof. The HBL 350 can be omitted. As an example, the HBL 350 can have a thickness of, but is not limited to, about 1 nm to about 100 nm.

The energy level and/or hole mobility of the materials included in the emissive layer 230 can be adjusted or controlled so as to induce charges to be injected rapidly to the EML 340, to prevent the materials in the emissive layer 230 from being deteriorated and improve the luminous lifespan of the OLED D1.

With referring to FIGS. 3 and 4, a lowest unoccupied molecular orbital (LUMO) energy level $LUMO^{CCL}$ of the second host 332 in the CCL 330 can be equal to or lower than a LUMO energy level $LUMO^{EML}$ of the first host 342, for example, P-type green host, in the EML 340. Accordingly, it is possible to minimize the deterioration of the materials in the emissive layer 230 as the electrons injected to the EML 340 from the ETL 360 are trapped at the dopant 334 in the CCL 330.

On the contrary, when the LUMO energy level $LUMO^{CCL}$ of the second host 332 is higher than the LUMO energy level $LUMO^{EML}$ of the first host 342, electrons cannot be transported to the CCL 330. In this case, luminescence is occurred at an interface between the CCL 330 and the EML 340 so that charges are accumulated at the interface between the CCL 330 and the EML 340, and thus, the luminous lifespan of OLED D1 can be reduced as the materials are deteriorated rapidly.

As an example, the LUMO energy level $LUMO^{CCL}$ of the second host 332 in the CCL 330 and the LUMO energy level LUMOEML of the first host in the EML 340 can be satisfy the following relationship in Equation (1):

$$-0.3\ \text{eV} \leq LUMO^{CCL} - LUMO^{EML} < 0\ \text{eV} \quad (1)$$

wherein, in the Equation (1), $LUMO^{CCL}$ indicates a LUMO energy level of the second host and $LUMO^{EML}$ indicates a LUMO energy level of the first host.

Alternatively or additionally, the second host 332 in the CCL 330 can have hole mobility three to ten times faster, for example, five to ten times faster, than hole mobility of the first host 342 in the EML 340. In addition, the hole mobility of the second host 332 in the CCL 330 can be ten to fifty times faster, for example, ten to forty times faster, than hole mobility of hole transporting material in the HTL 320.

In an example embodiment, the ground state dipole moment of the second host 332 in the CCL 330 can be between about 30% and about 90%, for example, about between 40% and about 80%, based upon the ground state dipole moment of the hole transporting material in the HTL 320. In addition, the excited state dipole moment of the second host 332 in the CCL 330 can be between about 15% and about 35%, for example, between about 20% and about 30%, based upon the excited state dipole moment of the hole transporting material in the HTL 320.

The CCL 330 includes the second host 332 having hole mobility higher than the hole mobility of the first host 342 in the EML 340 and the hole transporting material in the HTL 320. The holes provided from the HTL 320 can be injected into the EML 340 without being trapped at the dopant 334 in the CCL 330. Accordingly, the dopant 334 in the CCL 330 is not emitted substantially.

In an embodiment, a highest occupied molecular orbital (HOMO) energy level $HOMO^{CCL}$ of the second host 332 in the CCL 330 can be equal to or higher than a HOMO energy level $HOMO^{EML}$ of the first horst 342, for example, the P-type host, in the EML 340. Accordingly, holes can be injected rapidly to the EML 340 from the CCL 330.

For example, the HOMO energy level $HOMO^{CCL}$ of the second host 332 in the CCL 330 and the HOMO energy level $HOMO^{EML}$ of the first host 342 in the EML 340 can satisfy the following relationship in Equation (2):

$$0\ \text{eV} < HOMO^{CCL} - HOMO^{EML} \leq 0.3\ \text{eV} \quad (2)$$

wherein, in the Equation (2), $HOMO^{CCL}$ indicates a HOMO energy level of the second host and $HOMO^{EML}$ indicates a HOMO energy level of the first host.

In an embodiment, each of the LUMO energy level and the HOMO energy level of the N-type host can be lower than each of the LUMO energy level $LUMO_{CCL}$ and the HOMO energy level $HOMO^{CCL}$ of the second host 332 in the CCL 330, respectively, when the EML 340 includes the N-type host. For example, the LUMO energy level and the HOMO energy level of the N-type host can be lower than the LUMO energy level $LUMO^{CCL}$ and the HOMO energy level $HOMO^{CCL}$ of the second host 332, respectively, by about 0.5 eV to about 1.0 eV, but is not limited thereto.

In addition, the LUMO energy level $LUMO^{CCL}$ of the second host 332 in the CCL 330 can be equal to or higher than a LUMO energy level $LUMO^{HTL}$ of the hole transporting material in the HTL 320 when the OLED D1 includes the HTL 320. As an example, the LUMO energy level $LUMO^{CCL}$ of the second host 332 in the CCL 330 and the LUMO energy level $LUMO_{HTL}$ of the hole transporting material in the HTL 320 can satisfy the following relationship in Equation (3):

$$0\ \text{eV} \leq LUMO^{CCL} - LUMO^{HTL} < 0.5\ \text{eV} \quad (3)$$

wherein, in the Equation (3), $LUMO^{CCL}$ indicates a LUMO energy level of the second host and $LUMO^{HTL}$ indicates a LUMO energy level of the hole transporting material.

In still an embodiment, the HOMO energy level $HOMO^{CCL}$ of the second host 332 in the CCL 330 can be equal to or higher than a HOMO energy level $HOMO^{HTL}$ of the hole transporting material in the HTL 320. As an example, the HOMO energy level $HOMO^{CCL}$ of the second host 332 in the CCL 330 and the HOMO energy level $HOMO^{HTL}$ of the hole transporting material in the HTL 320 can satisfy the following relationship in Equation (4):

$$0\ \text{eV} < HOMO^{CCL} - HOMO^{HTL} \leq 0.3\ \text{eV} \quad (4)$$

wherein, in the Equation (4), $HOMO^{CCL}$ indicates a HOMO energy level of the second host and $HOMO^{HTL}$ indicates a HOMO energy level of the hole transporting material.

In addition, each of a LUMO energy level $LUMO^{HIL}$ and a HOMO energy level $HOMO^{HIL}$ of the HIL 310 (or P-CGL in the following tandem structure) can be higher than each of the LUMO energy level $LUMO^{HTL}$ and the HOMO energy level $HOMO^{HTL}$ of the hole transporting material in the HTL 320, respectively. As an example, the LUMO energy level $LUMO^{HIL}$ and the HOMO energy level $HOMO^{HIL}$ of the HIL 310 can be higher than the LUMO energy level $LUMO^{HTL}$ and the HOMO energy level $HOMO^{HTL}$ of the hole transporting material in the HTL 320 by about 0.05 eV to about 0.3 eV, but is not limited thereto.

In addition, each of a LUMO energy level $LUMO^{ETL}$ and a HOMO energy level $HOMO^{ETL}$ of the electron transporting material in the ETL 360 can be lower than the LUMO energy level $LUMO^{EML}$ and the HOMO energy level $HOMO^{EML}$ of the first host 342, for example, the P-type green host, in the EML 340, respectively. As an example, each of the LUMO energy level $LUMO^{ETL}$ and the HOMO energy level $HOMO^{ETL}$ of the electron transporting material in the ETL 360 can be lower than the LUMO energy level $LUMO^{EML}$ and the HOMO energy level $HOMO^{EML}$ of the first host 342 of the P-type green host by about 0.4 eV to about 1.0 eV, but is not limited thereto.

In an embodiment, each of the LUMO energy level $LUMO^{ETL}$ and the HOMO energy level $HOMO^{ETL}$ of the electron transporting material in the ETL 360 can be lower than a LUMO energy level $LUMO^{EIL}$ and a HOMO energy level $HOMO^{EIL}$ of the EIL 370 (or the following N-CGL in the tandem structure), respectively. As an example, each of the LUMO energy level $LUMO^{ETL}$ and the HOMO energy level $HOMO^{ETL}$ of the electron transporting material can be lower than the LUMO energy level $LUMO^{EIL}$ and the HOMO energy level $HOMO^{EIL}$ of the EIL 370 by about 0.1 eV to about 0.5 eV, respectively, but is not limited thereto.

The CCL 330, which includes the second host 332 having adjusted energy level and beneficial hole mobility and the dopant 334 having maximum luminescence peak in the range of longer than the maximum luminescence peak of the green emitter 344, is disposed between the first electrode 210 or the HTL 320 and the EML 340. It is possible to minimize the deterioration of the materials by preventing charges from accumulating at the interface between the EML 340 and the adjacently-disposed charge transport layer and by controlling hole mobility and an amount of hole injection to the EML 340. In addition, it is possible to improve the stability of HTL 320 because a part of electrons injected into the EML 340 through the ETL 360 is trapped in the CCL 330. Accordingly, the deterioration of materials at the interface between the EML 340 and the adjacently-disposed charge transport layer is minimized, and thus, it is possible to maximize the luminous lifespan of the OLED D1.

The OLED D1 with a single emitting part is shown in FIGS. 3 and 4. However, the OLED can include multiple emitting parts (FIGS. 6 to 8) each of which can include an emitting material layer with identical or similar luminescence peak ranges. As an example, each of the multiple emitting parts can emit green color.

Figure 5:
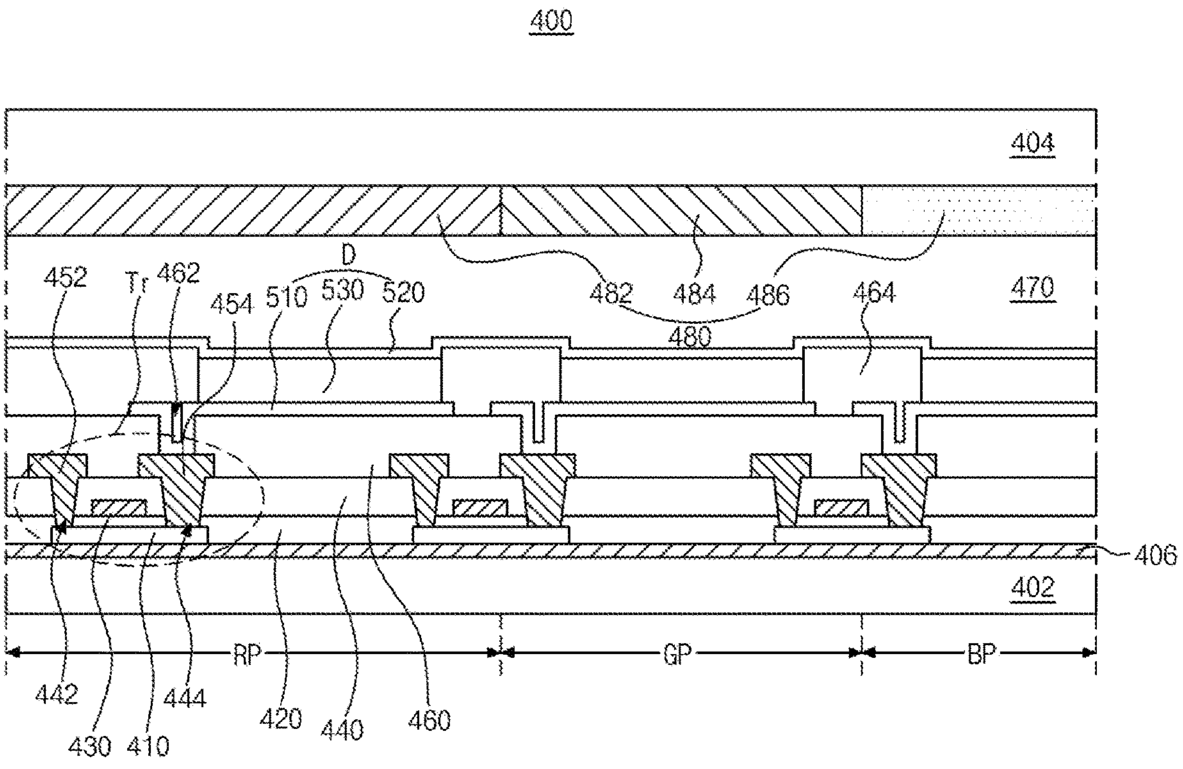
FIG. 5 illustrates a cross-sectional view of an organic light emitting display device in accordance with an example embodiment of the present disclosure.

In an example embodiment, an organic light emitting display device can implement full-color including white color. FIG. 5 illustrates a schematic cross-sectional view of an organic light emitting display device in accordance with an example embodiment of the present disclosure.

As illustrated in FIG. 5, the organic light emitting display device 400 comprises a first substrate 402 that defines each of a red pixel region RP, a green pixel region GP and a blue pixel region BP, a second substrate 404 facing the first substrate 402, a thin film transistor Tr on the first substrate 402, an OLED D disposed between the first and second substrates 402 and 404 and emitting white (W) light and a color filter layer 480 disposed between the OLED D and the second substrate 404.

Each of the first and second substrates 402 and 404 can include, but is not limited to, glass, flexible material and/or polymer plastics. For example, each of the first and second substrates 402 and 404 can be made of PI, PES, PEN, PET, PC and/or combinations thereof. The first substrate 402, on which a thin film transistor Tr and the OLED D are arranged, forms an array substrate.

A buffer layer 406 can be disposed on the first substrate 402. The thin film transistor Tr is disposed on the buffer layer 406 correspondingly to each of the red pixel region RP, the green pixel region GP and the blue pixel region BP. The buffer layer 406 can be omitted.

A semiconductor layer 410 is disposed on the buffer layer 406. The semiconductor layer 410 can be made of or include oxide semiconductor material or polycrystalline silicon.

A gate insulating layer 420 including an insulating material, for example, inorganic insulating material such as silicon oxide ($SiO_x$, wherein $0<x\leq2$) or silicon nitride ($SiN_x$, wherein $0<x\leq2$) is disposed on the semiconductor layer 410.

A gate electrode 430 made of a conductive material such as a metal is disposed over the gate insulating layer 420 so as to correspond to a center of the semiconductor layer 410. An interlayer insulating layer 440 including an insulating material, for example, inorganic insulating material such as $SiO_x$ or $SiN_x$, or an organic insulating material such as benzocyclobutene or photo-acryl, is disposed on the gate electrode 430.

The interlayer insulating layer 440 has first and second semiconductor layer contact holes 442 and 444 that expose or do not cover a portion of the surface nearer to the opposing ends than to a center of the semiconductor layer 410. The first and second semiconductor layer contact holes 442 and 444 are disposed on opposite sides of the gate electrode 430 with spacing apart from the gate electrode 430.

A source electrode 452 and a drain electrode 454, which are made of or include a conductive material such as a metal, are disposed on the interlayer insulating layer 440. The source electrode 452 and the drain electrode 454 are spaced apart from each other with respect to the gate electrode 430. The source electrode 452 and the drain electrode 454 contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 5, the gate line GL and the data line DL, which cross each other at the pixel region P, and a switching element Ts, which is connected to the gate line GL and the data line DL, can be further formed in the pixel region P. The switching element Ts is connected to the thin film transistor Tr, which is a driving element. In addition, the power line PL is spaced apart in parallel from the gate line GL or the data line DL, and the thin film transistor Tr can further include the storage capacitor Cst configured to constantly keep a voltage of the gate electrode 430 for one frame.

A passivation layer 460 is disposed on the source electrode 452 and the drain electrode 454 and covers the thin film transistor Tr over the whole first substrate 402. The passivation layer 460 has a drain contact hole 462 that exposes or does not cover the drain electrode 454 of the thin film transistor Tr.

The OLED D is located on the passivation layer 460. The OLED D includes a first electrode 510 that is connected to the drain electrode 454 of the thin film transistor Tr, a second electrode 520 facing the first electrode 510 and an emissive layer 530 disposed between the first and second electrodes 510 and 520.

The first electrode 510 formed for each pixel region RP, GP or BP can be an anode and can include a conductive material having relatively high work function value. For example, the first electrode 510 can include, but is not limited to, ITO, IZO, ITZO, SnO, ZnO, ICO, AZO, and/or combinations thereof. Alternatively or additionally, a reflective electrode or a reflective layer can be disposed under the first electrode 510. For example, the reflective electrode or the reflective layer can include, but is not limited to, Ag or APC alloy.

A bank layer 464 is disposed on the passivation layer 460 in order to cover edges of the first electrode 510. The bank layer 464 exposes or does not cover a center of the first electrode 510 corresponding to each of the red pixel region RP, the green pixel region GP and the blue pixel region BP. The bank layer 464 can be omitted.

Figure 6:
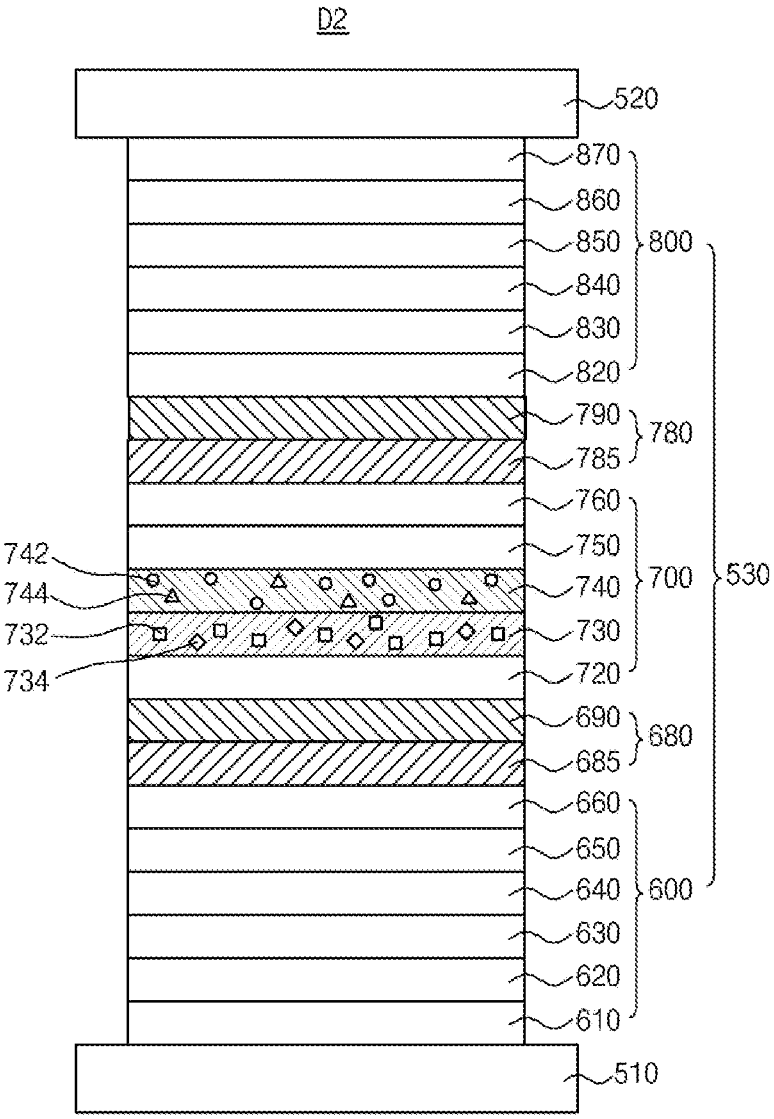
FIG. 6 illustrates a cross-sectional view of an organic light emitting diode having a tandem structure of multiple emitting parts in accordance with another example embodiment of the present disclosure.
Figure 7:
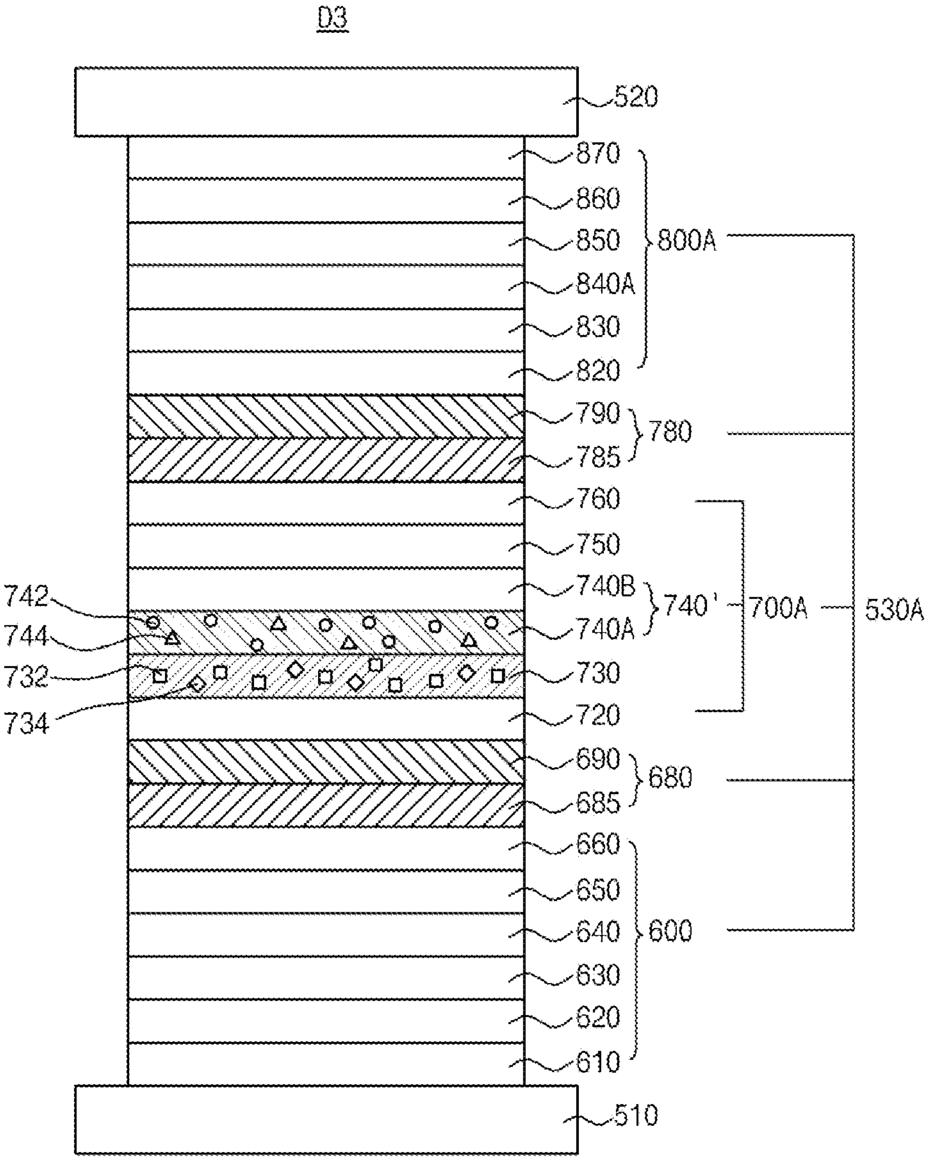
FIG. 7 illustrates a cross-sectional view of an organic light emitting diode having a tandem structure of multiple emitting parts in accordance with an example embodiment of the present disclosure.
Figure 8:
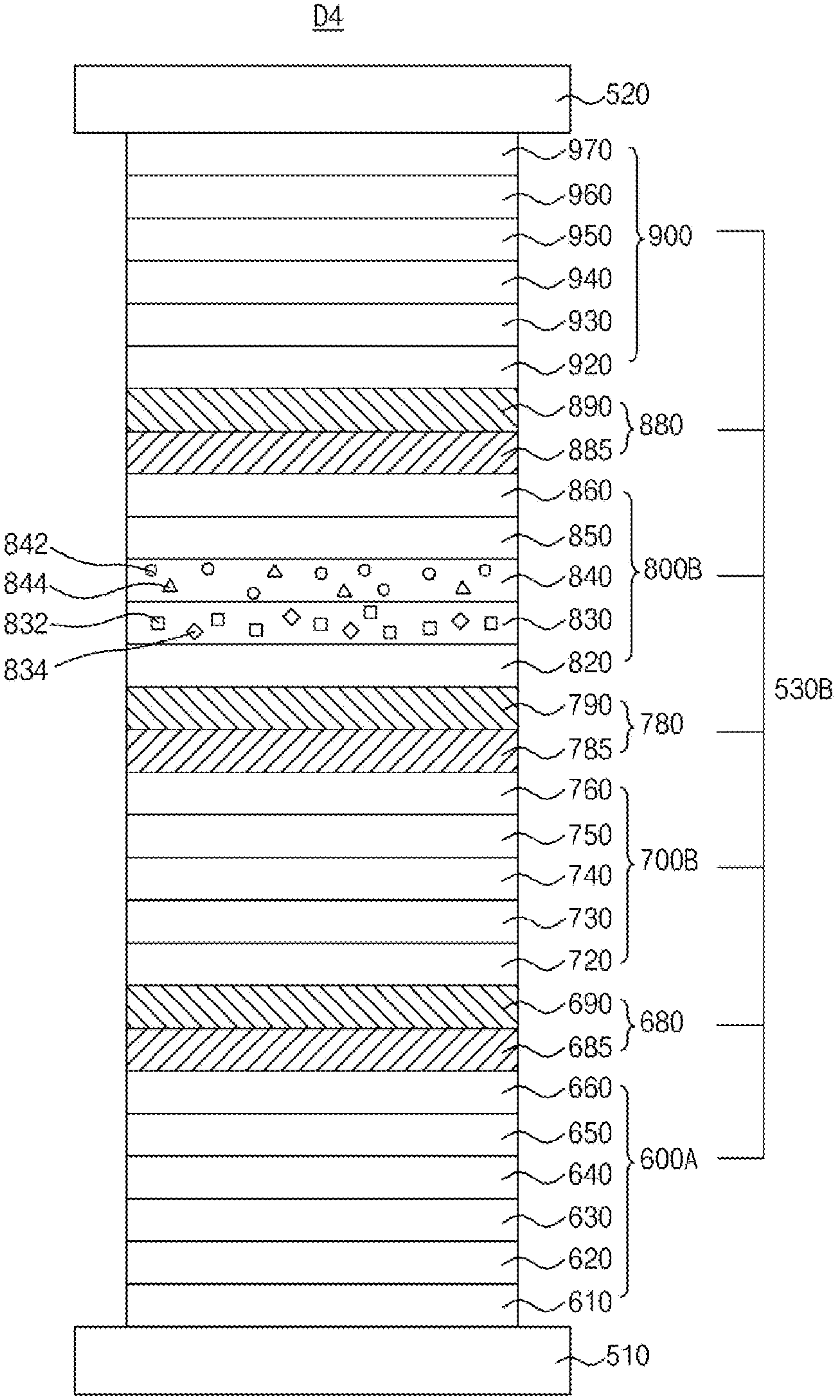
FIG. 8 illustrates a cross-sectional view of an organic light emitting diode having a tandem structure of multiple emitting parts in accordance with an example embodiment of the present disclosure.
Figure 9:
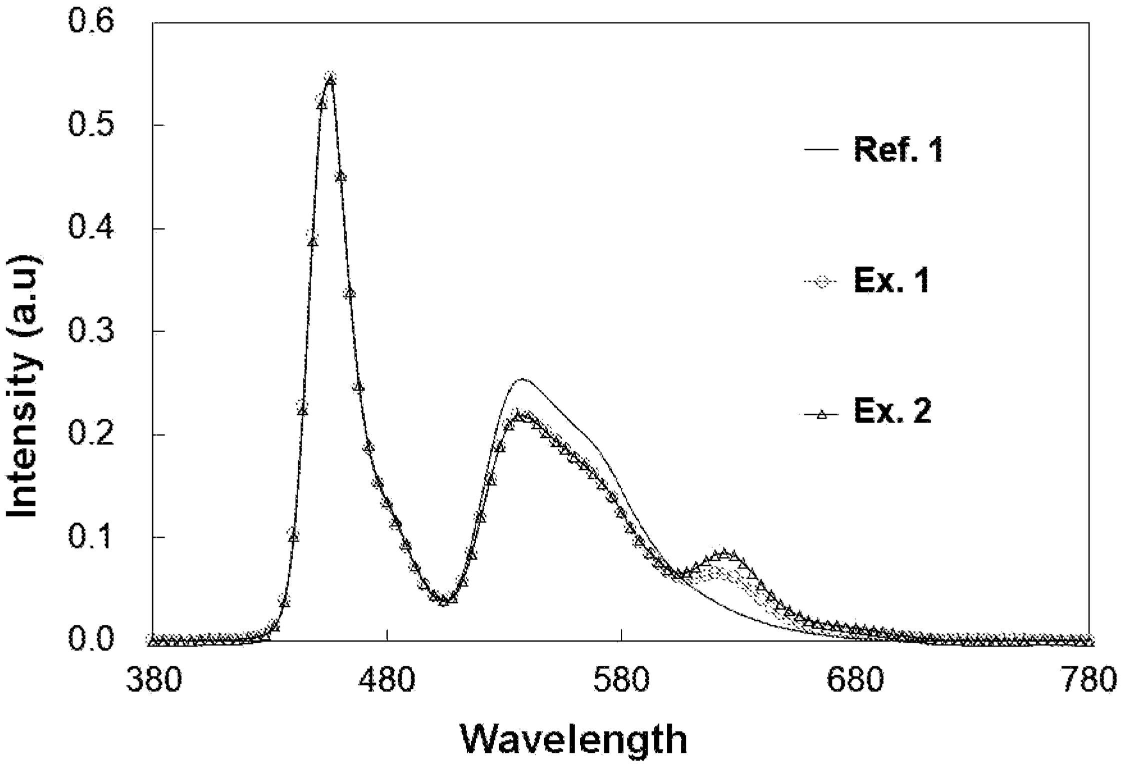
FIGS. 9 to 13 illustrates a graph showing measurement results of luminous intensity as wavelength ranges and time in an organic light emitting diode fabricated in an example of the present disclosure.
Figure 10:
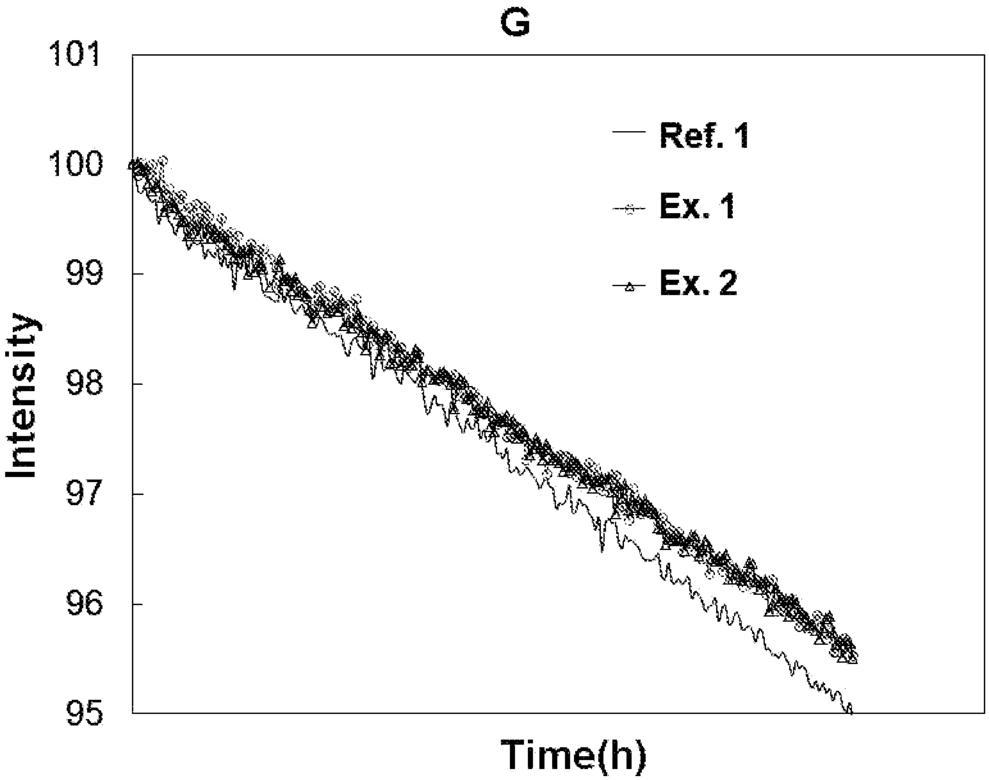
Figure 11:
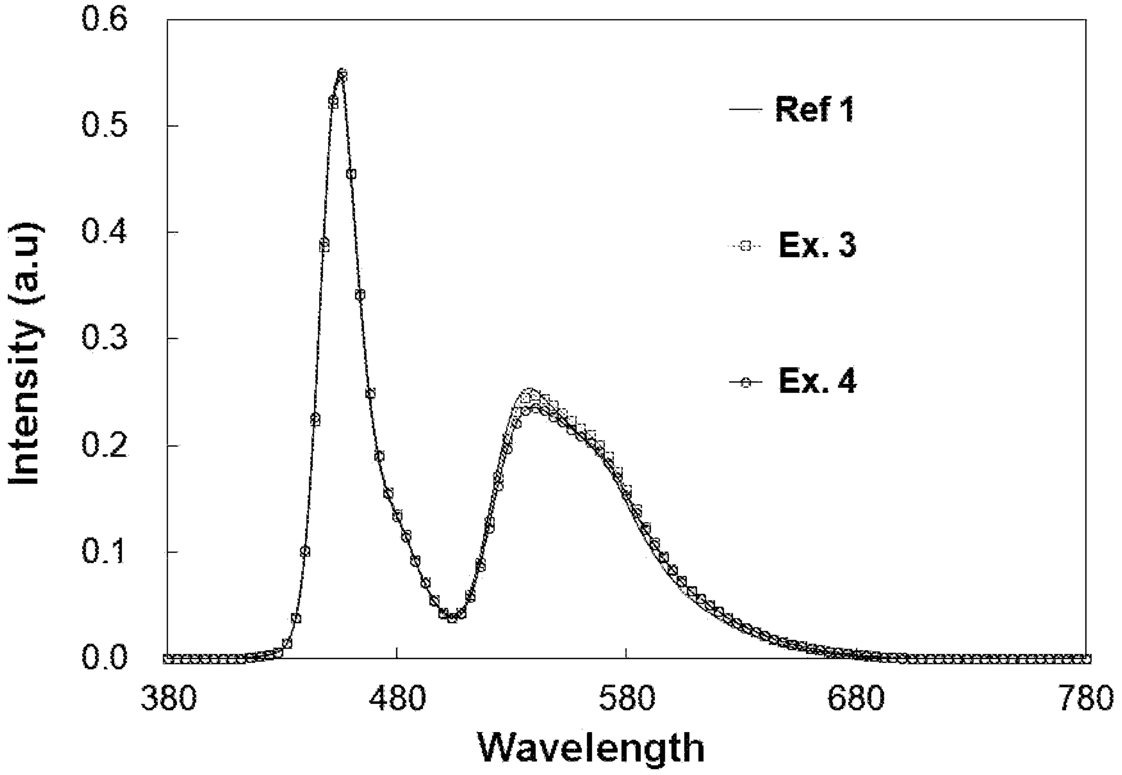
Figure 12:
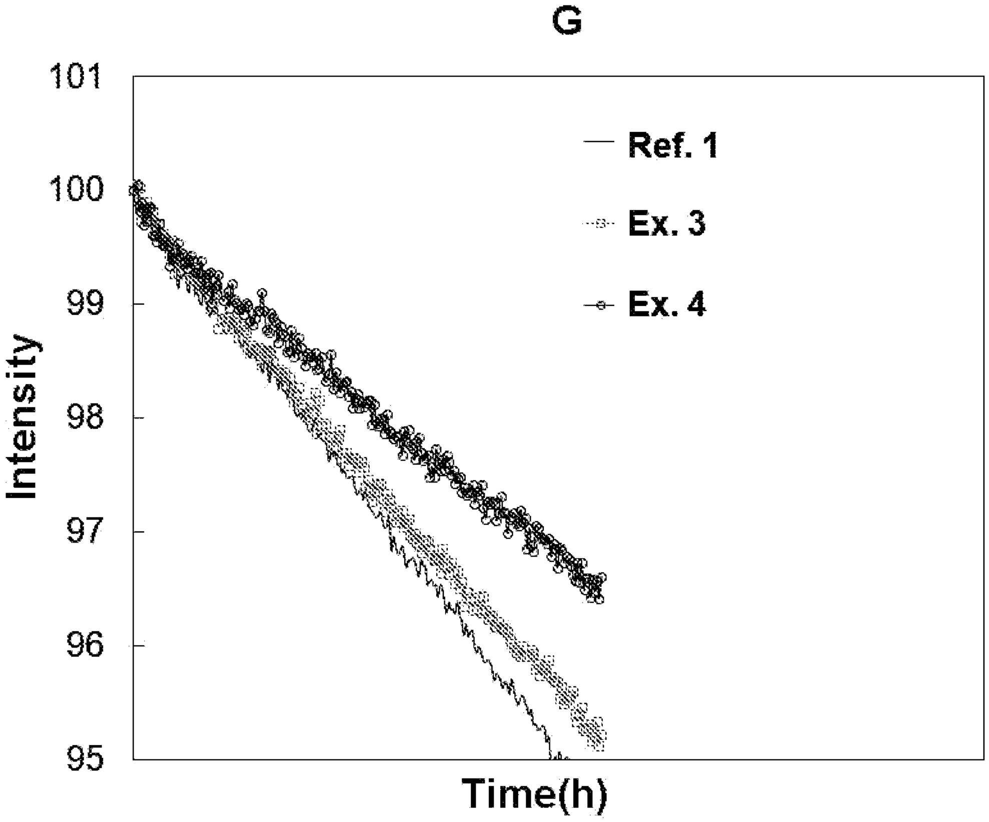
Figure 13:
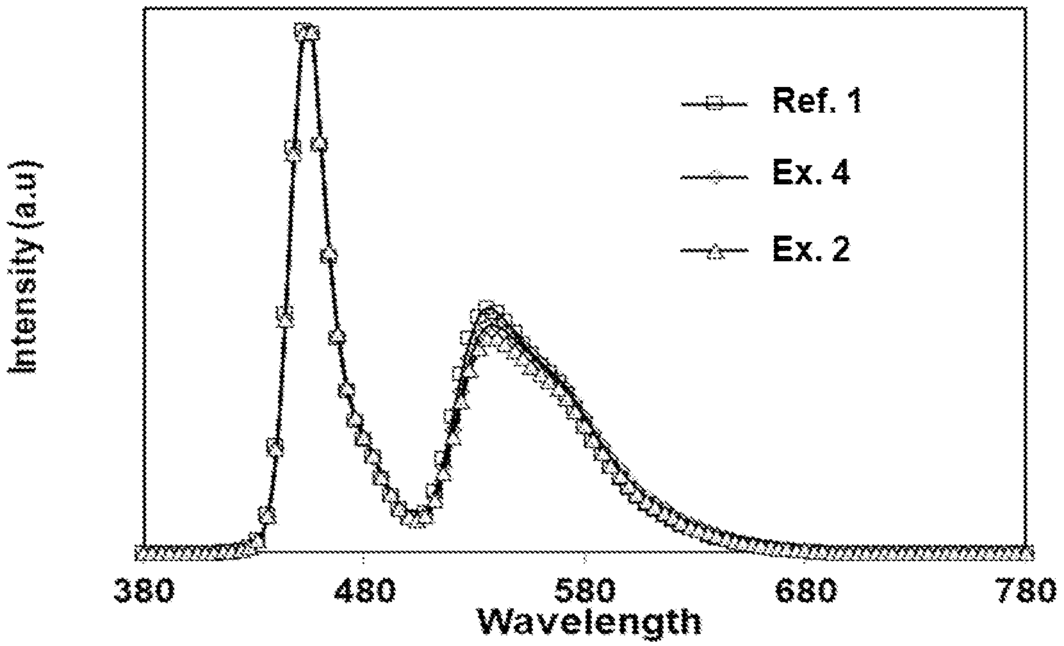

An emissive layer 530 that can include multiple emitting parts is disposed on the first electrode 510. As illustrated in FIGS. 6 to 8, the emissive layer 530 can include multiple emitting parts 600, 700, 700A, 800, 800A and 900, and at least one charge generation layer 680, 780 and 880. Each of the emitting parts 600, 700, 700A, 800, 800A and 900 includes at least one emitting material layer and can further include an HIL, an HTL, an EBL, an HBL, an ETL and/or an EIL.

The second electrode 520 can be disposed on the first substrate 402 above which the emissive layer 530 can be disposed. The second electrode 520 can be disposed over a whole display area, can include a conductive material with a relatively low work function value compared to the first electrode 510, and can be a cathode. For example, the second electrode 520 can include, but is not limited to, highly reflective material such as Al, Mg, Ca, Ag, alloy thereof, and/or combinations thereof such as Al-Mg.

Since the light emitted from the emissive layer 530 is incident to the color filter layer 480 through the second electrode 520 in the organic light emitting display device 400 in accordance with the second embodiment of the present disclosure, the second electrode 520 has a thin thickness so that the light can be transmitted.

The color filter layer 480 is disposed on the OLED D and includes a red color filter pattern 482, a green color filter pattern 484 and a blue color filter pattern 486 each of which is disposed correspondingly to the red pixel region RP, the green pixel region GP and the blue pixel region BP, respectively. Although not shown in FIG. 5, the color filter layer 480 can be attached to the OLED D through an adhesive layer. Alternatively or additionally, the color filter layer 480 can be disposed directly on the OLED D.

In addition, an encapsulation film 470 can be disposed on the second electrode 520 in order to prevent or reduce outer moisture from penetrating into the OLED D. The encapsulation film 470 can have, but is not limited to, a laminated structure including a first inorganic insulating film, an organic insulating film and a second inorganic insulating film (170 in FIG. 2). In addition, a polarizing plate can be attached onto the second substrate 404 to reduce reflection of external light. For example, the polarizing plate can be a circular polarizing plate.

In FIG. 5, the light emitted from the OLED D is transmitted through the second electrode 520 and the color filter layer 480 is disposed on the OLED D. Alternatively or additionally, the light emitted from the OLED D is transmitted through the first electrode 510 and the color filter layer 480 can be disposed between the OLED D and the first substrate 402.

In addition, a color conversion layer may be formed or disposed between the OLED D and the color filter layer 480. The color conversion layer may include a red color conversion layer, a green color conversion layer and a blue color conversion layer each of which is disposed correspondingly to each pixel region (RP, GP and BP), respectively, so as to convert the white (W) color light to each of a red, green and blue color lights, respectively. Alternatively or additionally, the organic light emitting display device 400 can comprise the color conversion layer instead of the color filter layer 480.

As described above, the white (W) color light emitted from the OLED D is transmitted through the red color filter pattern 482, the green color filter pattern 484 and the blue color filter pattern 486 each of which is disposed correspondingly to the red pixel region RP, the green pixel region GP and the blue pixel region BP, respectively, so that red, green and blue color lights are displayed in the red pixel region RP, the green pixel region GP and the blue pixel region BP, respectively.

An OLED that can be applied into the organic light emitting display device will be described in more detail. FIG. 6 illustrates a schematic cross-sectional view of an organic light emitting diode having a tandem structure of three emitting parts. As illustrated in FIG. 6, the OLED D2 in accordance with the example embodiment of the present disclosure includes first and second electrodes 510 and 520 and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520, a third emitting part 800 disposed between the second emitting part 700 and the second electrode 520, a first charge generation layer (CGL1) 680 disposed between the first and second emitting parts 600 and 700, and a second charge generation layer (CGL2) 780 disposed between the second and third emitting parts 700 and 800.

The first electrode 510 can be an anode and can include a conductive material having relatively high work function value such as TCO. For example, the first electrode 510 can include, but is not limited to, ITO, IZO, ITZO, SnO, ZnO, ICO, AZO, and/or combinations thereof. The second electrode 520 can be a cathode and can include a conductive material with a relatively low work function value. For example, the second electrode 520 can include, but is not limited to, highly reflective material such as Al, Mg, Ca, Ag, alloy thereof and/or combination thereof such as Al—Mg.

In the OLED D2, one of the first to third emitting parts 600, 700 and 800 can emit blue color light, another of the first to third emitting parts 600, 700 and 800 can emit green color light, and the rest of the first to third emitting parts 600, 700 and 800 can emit red color light, so that the OLED D2 can implement white emission. Hereinafter, the OLED D2 where the first emitting part 600 emits blue color light, the second emitting part 700 emits green color light and the third emitting part 800 emits red color light will be described in detail.

The first emitting part 600 includes a first emitting material layer (lower emitting material layer, EML1) 640. The first emitting part 600 can include at least one of a hole injection layer (HIL) 610 disposed between the first electrode 510 and the EML1 640, a first hole transport layer (lower hole transport layer, HTL1) 620 disposed between the HIL 610 and the EML1 640, and a first electron transport layer (lower electron transport layer, ETL1) 660 disposed between the EML1 640 and the CGL1 680. Alternatively or additionally, the first emitting part 600 can further include a first electron blocking layer (lower electron blocking layer, EBL1) 630 disposed between the HTL1 620 and the EML1 640 and/or a first hole blocking layer (lower hole blocking layer, HBL1) 650 disposed between the EML1 640 and the ETL1 660.

The second emitting part 700 includes a second emitting material layer (middle emitting material layer, EML2) 740, and a charge control layer (CCL) 730 disposed between the CGL1 680 and the EML2 740. The second emitting part 700 can include at least one of a second hole transport layer (middle hole transport layer, HTL2) 720 disposed between the CGL1 680 and the CCL 730 and a second electron transport layer (middle electron transport layer, ETL2) 760 disposed between the EML2 740 and the CGL2 780. The HTL2 720 can be omitted. Alternatively or additionally, the second emitting part 700 can further include a second hole blocking layer (middle hole blocking layer, HBL2) 750 disposed between the EML2 740 and the ETL2 760.

The third emitting part 800 includes a third emitting material layer (upper emitting material layer, EML3) 840. The third emitting part 800 can include at least one of a third hole transport layer (upper hole transport layer, HTL3) 820 disposed between the CGL2 780 and the EML3 840, a third electron transport layer (upper electron transport layer, ETL3) 860 disposed between the EML3 840 and the second electrode 520, and an electron injection layer (EIL) 870 disposed between the ETL3 860 and the second electrode 520. Alternatively or additionally, the third emitting part 800 can further include at least one of a second electron blocking layer (upper electron blocking layer, EBL2) 830 disposed between the HTL3 820 and the EML3 840 and a third hole blocking layer (upper hole blocking layer, HBL3) 850 disposed between the EML3 840 and the ETL3 860.

The HIL 610 is disposed between the first electrode 510 and the HTL1 620 and improves an interface property between the inorganic first electrode 510 and the organic HTL1 620. In an example embodiment, the HIL 610 can include, but is not limited to, MTDATA, NATA, 1T-NATA, 2T-NATA, CuPc, TCTA, NPB (NPD), DNTPD, HAT-CN, TDAPB, PEDOT/PSS, N-(biphenyl-4-yl)-9,9-dimethyl-N-(4-(9-phenyl-9H-carbazol-3-yl)phenyl)-9H-fluoren-2-amine, NPNPB, $MgF_2$, $CaF_2$ and/or combinations thereof. Alternatively or additionally, the HIL 610 can include a host of the hole injecting material and/or the hole transporting material and a P-type dopant that can be HAT-CN, F4-TCNQ, F6-TCNNQ, NPD9 and/or combinations thereof. As an example, the hole injecting host can be an aryl amine-based compound with a spirofluorene moiety and/or a hetero aryl amine-based compound with a spirofluorene moiety as a second host 732 of the CCL 730. The HIL 610 can be omitted in compliance of the OLED D2 property.

In an example embodiment, each of the HTL1 620, the HTL2 720 and the HTL3 820 can include, but is not limited to, TPD, NPB (NPD), DNTPD, BPBPA, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and/or combination thereof. Alternatively or additionally, each of the HTL1 620, the HTL2 720 and the HTL3 820 can include, but is not limited to, an aryl amine-based compound with a spirofluorene moiety and/or a hetero aryl amine-based compound with a spirofluorene moiety as the second host 732 in the CCL 730.

Each of the ETL1 660, the ETL2 760 and the ETL3 860 transports electrons to each of the EML1 640, the EML2 740 and the EML3 840, respectively. As an example, each of the ETL1 660, the ETL2 760 and the ETL3 860 can include at least one of an oxadiazole-based compound, a triazole-based compound, a phenanthroline-based compound, a benzoxazole-based compound, a benzothiazole-based compound, a benzimidazole-based compound and a triazine-based compound.

For example, each of the ETL1 660, the ETL2 760 and the ETL3 860 can include, but is not limited to, $Alq_3$, PBD, spiro-PBD, Liq, TPBi, BAlq, Bphen, NBphen, BCP, TAZ, NTAZ, TpPyPB, TmPPPyTz, PFNBr, TPQ, TSPO1, ZADN and/or combinations thereof.

The EIL 870 is disposed between the second electrode 520 and the ETL3 860, and can improve physical properties of the second electrode 520 and therefore, can enhance the lifespan of the OLED D2. In an example embodiment, the EIL 870 can include, but is not limited to, an alkali metal halide or an alkaline earth metal halide such as LiF, CsF, NaF, $BaF_2$ and the like, and/or an organometallic compound such as Liq, lithium benzoate, sodium stearate, and the like.

Each of the EBL1 630 and the EBL2 830 can independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo[b,d]thiophene and/or combinations thereof, respectively.

Each of the HBL1 650, the HBL2 750 and the HBL3 850 can include, but is not limited to, at least one of an oxadiazole-based compound, a triazole-based compound, a phenanthroline-based compound, a benzoxazole-based compound, a benzothiazole-based compound, a benzimidazole-based compound, and a triazine-based compound. For example, each of the HBL1 650, the HBL2 750 and the HBL3 850 can independently include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole, TSPO1 and/or combinations thereof, respectively.

The CGL1 680 is disposed between the first emitting part 600 and the second emitting part 700. The CGL1 680 includes a first N-type CGL (N-CGL1) 685 disposed adjacently to the first emitting part 600 and a first P-type CGL (P-CGL1) 690 disposed adjacently to the second emitting part 700. The N-CGL1 685 injects electrons to the EML1 640 of the first emitting part 600 and the P-CGL1 690 injects holes to the EML2 740 of the second emitting part 700.

The CGL2 780 is disposed between the second emitting part 700 and the third emitting part 800. The CGL2 780 includes a second N-type CGL (N-CGL2) 785 disposed adjacently to the second emitting part 700 and a second P-type CGL (P-CGL2) 790 disposed adjacently to the third emitting part 800. The N-CGL2 785 injects electrons to the EML2 740 of the second emitting part 700 and the P-CGL2 790 injects holes to the EML3 840 of the third emitting part 800.

Each of the N-CGL1 685 and the N-CGL2 785 can be an organic layer doped with an alkali metal such as Li, Na, K and Cs and/or an alkaline earth metal such as Mg, Sr, Ba and Ra. For example, the host in each of the N-CGL1 685 and the N-CGL2 785 can include, but is not limited to, Bphen and MTDATA. The contents of the alkali metal or the alkaline earth metal in each of the N-CGL1 685 and the N-CGL2 785 can be between about 0.01 wt % and about 30 wt %.

Each of the P-CGL1 690 and the P-CGL2 790 can include, but is not limited to, inorganic material selected from the group consisting of $WO_x$, $MoO_x$, $Be_2O_3$, $V_2O_5$ and combinations thereof and/or organic material selected from the group consisting of NPD, DNTPD, HAT-CN, F4-TCNQ, F6-TCNNQ, TPD, N,N,N',N'-tetranaphthalenyl-benzidine (TNB), TCTA, N,N'-dioctyl-3,4,9,10-perylenedicarboximide (PTCDI-C8) and/or combinations thereof. Alternatively or additionally, each of the P-CGL1 690 and the P-CGL2 790 can independently include an organic compound selected from an aryl amine-based compound with a spirofluorene moiety, a hetero aryl amine-based compound with a spirofluorene moiety and/or combinations thereof as the second host 732 in the CCL 730.

Alternatively or additionally, each of the P-CGL1 690 and the P-CGL2 790 can include a host of NPD, DNTPD, TPD, TNB, TCTA, the aryl amine-based compound with a spirofluorene moiety, the hetero aryl amine-based compound with a spirofluorene moiety and/or combinations thereof, and a P-type dopant of F4-TCNQ, F6-TCNNQ, NPD-9 and combinations thereof. The contents of the P-type dopant in each of the P-CGL1 690 and the P-CGL2 790 can be, but is not limited to, about 1 wt % to about 30 wt %, for example, about 3 wt % to about 25 wt %.

The EML1 640 can be a blue EML. In this case, the EML1 640 can be a blue EML, a sky-blue EML or a deep-blue EML. The EML1 640 can include a blue host and a blue emitter.

For example, the blue host can include, but is not limited to, mCP, mCP-CN, mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spirobifluoren-2-yl-diphenyl-phosphine oxide (SPPO1), 9,9'-(5-(Triphenylsilyl)-1,3-phenylene)bis(9H-carbazole) (SimCP), 2-methyl-9,10-bis(naphthalen-2-yl)anthracene (MADN) and/or combinations thereof.

The blue emitter can include at least one of blue phosphorescent material, blue fluorescent material and blue delayed fluorescent material. For example, the blue emitter can include, but is not limited to, perylene, 4,4'-Bis[4-(di-p-tolylamino)styryl]biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spirofluorene (spiro-DPVBi), [1,4-bis[2-[4-[N,N-di(p-tolyl)amino]phenyl]vinyl] benzene (DSB), 1-4-di-[4-(N,N-diphenyl)amino]styryl-benzene (DSA), 2,5,8,11-Tetra-tetr-butylperylene (TBPe), Bis(2-hydroxylphenyl)-pyridine)beryllium (Bepp 2), 9-(9-Phenylcarbazol-3-yl)-10-(naphthalen-1-yl)anthracene (PCAN), mer-Tris(1-phenyl-3-methylimidazolin-2-ylidene-C,C(2)')iridium(III) (mer-Ir(pmi)$_3$), fac-Tris(1,3-diphenyl-benzimidazolin-2-ylidene-C,C(2)')iridium(III) (fac-Ir (dpbic)$_3$), Bis(3,4,5-trifluoro-2-(2-pyridyl)phenyl-(2-carboxypyridyl))iridium(III) (Ir(tfpd)$_2$pic), tris(2-(4,6-difluorophenyl)pyridine)iridium(III) (Ir(Fppy)$_3$), Bis[2-(4,6-difluorophenyl)pyridinato-$C^2$,N](picolinato)iridium(III) (Flrpic), DABNA-1, DABNA-2, t-DABNA, v-DABNA and/or combinations thereof.

The EML2 740 can include a first host 742 of the P-type green host and a green emitter 744. Alternatively or additionally, the EML2 740 can further include an N-type green host. The first host 742 including the P-type green host, and optionally, the N-type green host and the green emitter 744 can be identical to materials with referring to FIGS. 3 and 4.

The CCL 730 include a second host 732, which can be an aryl amine-based compound with a spirofluorene moiety and/or a hetero aryl amine-based compound with a spirofluorene moiety, and a dopant 734 having maximum luminescence peak in the wavelength range longer than the maximum luminescence peak of the green emitter 744. The second host 732 and the dopant 734 can be identical to materials with referring to FIGS. 3 and 4. In addition, the LUMO energy levels, the HOMO energy levels, hole mobilities of the organic layer in the second emitting part 700 can be identical to those with referring to FIG. 4.

For example, the LUMO energy level of the second host 732 in the CCL 730 can be equal to or lower than the LUMO energy level of the first host 742, for example, the P-type green host, in the EML2 740. The LUMO energy level of the second host 732 and the LUMO energy level of the first host 742 can satisfy the relationship in Equation (1). The second host 732 can have hole mobility of three to ten times faster, for example, five to ten times faster, than the hole mobility of the first host 742, and of ten to fifty times faster, for example, ten to forty times faster, than the hole mobility of the hole transporting material in the HTL2 720.

The HOMO energy level of the second host 732 in the CCL 730 can be equal to or higher than the HOMO energy level of the first host 742, for example, the P-type green host, in the EML2 740. For example, the HOMO energy level of the second host 732 and the HOMO energy level of the first host 742 can satisfy the relationship in Equation (2).

Also, the LUMO energy level of the second host 732 in the CCL 730 can be equal to or higher than the LUMO energy level of the hole transporting material in the HTL2 720. For example, the LUMO energy level of the second host 732 and the LUMO energy level of the hole transporting material in the HTL2 720 can satisfy the relationship in Equation (3).

In addition, the HOMO energy level of the second host 732 in the CCL 730 can be equal to or higher than the HOMO energy level of the hole transporting material in the HTL2 720. For example, the HOMO energy level of the second host 732 and the HOMO energy level of the hole transporting material in the HTL2 720 can satisfy the relationship in Equation (4).

The EML3 840 can be a red EML. The EML3 840 can include a red host and a red emitter. The red host can include the green host 342 with referring to FIG. 3 and/or the blue host that can be included in the EML1 640.

For Example, the red host can include, but is not limited to, mCP-CN, CBP, mCBP, mCP, DPEPO, PPT, TmPyPB, PYD-2Cz, DCzDB, DCzTPA, pCzB-2CN, mCzB-2CN, TSPO1, CCP, 4-(3-(triphenylen-2-yl)phenyl)dibenzo[b,d] thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole, BCzPh, TCP, TCTA, CDBP, DMFL-CBP, Spiro-CBP, Cz1, BPBPA, TBPi and/or combinations thereof.

The red emitter can include red phosphorescent material, red fluorescent material and/or red delayed fluorescent material. In an example embodiment, the red emitter can be the red dopant as the dopant 734 in the CCL 730.

As an example, the red emitter can include, but is not limited to, Bis[2-(4,6-dimethyl)phenylquinoline)](2,2,6,6-tetramethylheptane-3,5-dionate) iridium (III), Hex-Ir(phq)$_2$ (acac), Hex-Ir(phq)$_3$, Ir(Mphq)$_3$, Ir(dpm)PQ$_2$, Ir(dpm)(piq)

$_2$, $Ir(piq)_2(acac)$, Hex-$Ir(piq)_2(acac)$, Hex-$Ir(piq)_3$, Ir(dmpq)$_3$, $Ir(dmpq)_2(acac)$, $Ir(mphmq)_2(acac)$, $Eu(dbm)_3(phen)$, and combinations thereof.

The LUMO energy levels, the HOMO energy levels and hole mobilities of the first host 742 in the EML2 740, the second host 732 in the CCL 730 and the hole transporting material in the HTL2 720 are adjusted. It is possible to minimize charge accumulations at the interface between the EML2 740 and the adjacently-disposed charge transport layer and prevent material from being deteriorated owing to holes by adjusting hole mobility and an amount of hole injection to the EML2 740. In addition, it is possible to improve the stability of the HTL2 720 because electrons injected into the EML2 740 from the ETL2 760 are trapped in the CCL 730, and thereby improving the luminous lifespan of the OLED D2.

In addition, in the prior art white organic light emitting diode with a tandem structure, a yellow-green emitting material layer is disposed adjacently to a green emitting material layer. While the yellow-green emitting material layer can improve the luminous lifespan and luminance of the organic light emitting diode, the yellow-green emitting material layer reduces the color purity and color gamut of the green and red color lights. The green emitter, which is emitted in the relatively short luminescence wavelength compared to the red and yellow-green emitter emitting in the red and yellow-green luminescence wavelengths, has relatively wider bandgap. Because the green emitter has relatively high luminous energy, the green emitter with beneficial luminous efficiency is deteriorated in driving the organic light emitting diode, and thus, the luminous lifespan of the green emitter can be reduced. In order to improve the luminous lifespan of the green emitter, the thickness of the green emitting material layer can be increased or the hole mobility in the charge transport layer disposed adjacently to the green emitting material layer can be lowered. In this case, the driving voltage of the organic light emitting diode can be increased considerably, and thus, consume power of the organic light emitting diode can be increased.

On the contrary, the OLED D2 does not include any yellow-green emitting material layer. In other word, the second emitting part 700 includes the CCL 730 disposed adjacently to the EML2 740 and including the second host 732 having controlled energy levels and hole mobility and the dopant 734 which is not emitted substantially. By excluding the yellow-green emitting material layer, the color purity of the emitting light in the OLED D2 can be improved and color gamut in the OLED D2 can be enhanced as the Color Reproduction Range such as BT2020 and DCT overlapping ratio is improved. In addition, the driving voltage of the OLED D2 is not increased significantly.

In FIG. 6, the OLED with three stack structure in which each emitting part emits different colors has been described. The organic light emitting diode can emit white color light when one emitting part emits red-green color light. FIG. 7 illustrates a schematic cross-sectional view of an organic light emitting diode having a tandem structure of multiple emitting parts in accordance with an example embodiment of the present disclosure.

As illustrated in FIG. 7, the OLED D3 in accordance with the present disclosure includes first and second electrodes 510 and 520 facing each other and an emissive layer 530A disposed between the first and second electrodes 510 and 520. The emissive layer 530A includes a first emitting part 600 disposed between the first electrode 510 and the second electrode 520, a second emitting part 700A disposed between the first emitting part 600 and the second electrode 520, a third emitting part 800A disposed between the second emitting part 700A and the second electrode 520, a first charge generation layer (CGL1) 680 disposed between the first and second emitting parts 600 and 700A, and a second charge generation layer (CGL2) 780 disposed between the second and third emitting parts 700A and 800A.

The first electrode 510 can be an anode and can include a conductive material having relatively high work function value such as TCO. The second electrode 520 can be a cathode and can include a conductive material with a relatively low work function value such as highly reflective material.

In the OLED D3, two of the first to third emitting parts 600, 700A and 800A emit blue color light, and the rest of the first to third emitting parts 600, 700A and 800A emits red-green color light so that the OLED D3 can emit white color light. Hereinafter, the OLED D3 where the first emitting part 600 and the third emitting part 800A emit blue color light and the second emitting part 700A emits red-green color light will be described in detail.

The first emitting part 600 includes a first emitting material layer (lower emitting material layer, EML1) 640. The first emitting part 600 can include at least one of a hole injection layer (HIL) 610 disposed between the first electrode 510 and the EML1 640, a first hole transport layer (lower hole transport layer, HTL1) 620 disposed between the HIL 610 and the EML1 640, and a first electron transport layer (lower electron transport layer, ETL1) 660 disposed between the EML1 640 and the CGL1 680. Alternatively or additionally, the first emitting part 600 can further include a first electron blocking layer (lower electron blocking layer, EBL1) 630 disposed between the HTL1 620 and the EML1 640 and/or a first hole blocking layer (lower hole blocking layer, HBL1) 650 disposed between the EML1 640 and the ETL1 660.

The second emitting part 700A includes a second emitting material layer (middle emitting material layer, EML2) 740', and a charge control layer (CCL) 730 disposed between the CGL1 680 and the EML2 740'. The second emitting part 700A can include at least one of a second hole transport layer (middle hole transport layer, HTL2) 720 disposed between the CGL1 680 and the CCL 730 and a second electron transport layer (middle electron transport layer, ETL2) 760 disposed between the EML2 740' and the CGL2 780. The HTL2 720 can be omitted. Alternatively or additionally, the second emitting part 700A can further include a second hole blocking layer (middle hole blocking layer, HBL2) 750 disposed between the EML2 740' and the ETL2 760.

The third emitting part 800A includes a third emitting material layer (upper emitting material layer, EML3) 840A. The third emitting part 800A can include at least one of a third hole transport layer (upper hole transport layer, HTL3) 820 disposed between the CGL2 780 and the EML3 840A, a third electron transport layer (upper electron transport layer, ETL3) 860 disposed between the EML3 840A and the second electrode 520, and an electron injection layer (EIL) 870 disposed between the ETL3 860 and the second electrode 520. Alternatively or additionally, the third emitting part 800A can further include at least one of a second electron blocking layer (upper electron blocking layer, EBL2) 830 disposed between the HTL3 820 and the EML3 840A and a third hole blocking layer (upper hole blocking layer, HBL3) 850 disposed between the EML3 840A and the ETL3 860.

The materials in the OLED D3 can be identical to the corresponding materials with referring to FIG. 6 otherwise described.

Each of the EML1 640 and the EML3 840A can be a blue emitting material layer. In this case, each of the EML1 640 and the EML3 840A can independently a blue EML, a sky-blue EML or a deep-blue EML. Each of the EML1 640 and the EML3 840A can include a blue host and a blue emitter. The blue host and the blue emitter can be identical to the corresponding materials with referring to FIG. 6. For example, the blue emitter can include at least one of blue phosphorescent material, blue fluorescent material and blue delayed fluorescent material. Alternatively or additionally, the blue host and/or the blue emitter in the EML1 640 can be different from the blue host and/or the blue emitter in the EML3 840A in terms of luminous color and luminous efficiency.

The EML2 740' can include a first layer 740A and a second layer 740B disposed sequentially between the CCL 730 and the HBL2 750. One of the first layer 740A and the second layer 740B can emit red color light and the other of the first layer 740A and the second layer 740B can emit green color light. Hereinafter, the OLED D3 where the first layer 740A emits green color light and the second layer 740B emits red color light will be described in detail.

The first layer 740A can include a first host 742 which can be a P-type green host and a green emitter 744. Alternatively or additionally, the first layer 740A can further include an N-type green host. The first host 742 including the P-type green host, and optionally the N-type green host, and the green emitter 744 can be identical to the corresponding materials with referring to FIGS. 3 and 4.

The second layer 740B can be a red EML. The second layer 740B can include a red host and a red emitter. The red host and the red emitter can be identical to the corresponding materials with referring to FIG. 6.

The CCL 730 includes a second host 732, which can be an aryl amine-based compound with a spirofluorene moiety and/or a hetero aryl amine-based compound with a spirofluorene moiety, and a dopant 734 having maximum luminescence peak in the wavelength range longer than the maximum luminescence wavelength of the green emitter 744. The second host 732 and the dopant 734 can be identical to the corresponding material with referring to FIGS. 3 and 4. The LUMO energy levels, HOMO energy levels and hole mobilities of the organic layer in the second emitting part 700A can be identical to the corresponding energy levels and hole mobilities with referring to FIG. 4.

The LUMO energy levels, the HOMO energy levels and hole mobilities of the first host 742 in the first layer 740A as the green EML, the second host 732 in the CCL 730 and the hole transporting material in the HTL2 720 are adjusted. It is possible to minimize charge accumulations at the interface between the first layer 740A and the adjacently-disposed charge transport layer and prevent material from being deteriorated owing to holes by adjusting hole mobility and an amount of hole injection to the EML2 740'. In addition, it is possible to improve the stability of the HTL2 720 because electrons injected into the EML2 740' from the ETL2 760 are trapped in the CCL 730, and thereby improving the luminous lifespan of the OLED D3.

In addition, the OLED D3 emitting white color light does not include yellow-green EML. Accordingly, the color purity of the emitting light in the OLED D3 can be improved and color gamut in the OLED D3 can be enhanced as the Color Reproduction Range such as BT2020 and DCT overlapping ratio is improved.

In FIG. 7, the OLED D3 where three emitting parts are connected to have a tandem structure is illustrated. Alternatively or additionally, one of the first emitting part 600 and the third emitting part 800A each of which emits blue color light and one of CGLs 680 and 780 adjacently to those emitting parts can be omitted so that the OLED where two emitting parts are connected to have a tandem structure can be manufactured.

In FIGS. 6 and 7, the OLED with two or three emitting parts are illustrated. The organic light emitting diode can have a tandem structure with four or more emitting parts. FIG. 8 illustrates a schematic cross-sectional view of an organic light emitting diode having a tandem structure of multiple emitting parts in accordance with an example embodiment of the present disclosure.

As illustrated in FIG. 8, the OLED D4 in accordance with the present disclosure includes first and second electrodes 510 and 520 facing each other and an emissive layer 530B disposed between the first electrode 510 and the second electrode 520.

The emissive layer 530B includes a first emitting part 600A disposed between the first electrode 510 and the second electrode 520, a second emitting part 700B disposed between the first emitting part 600A and the second electrode 520, a third emitting part 800B disposed between the second emitting part 700B and the second electrode 520, a fourth emitting part 900 disposed between the third emitting part 800B and the second electrode 520, a first charge generation layer (CGL1) 680 disposed between the first and second emitting parts 600A and 700B, a second charge generation layer (CGL2) 780 disposed between the second and third emitting parts 700B and 800B, and a third charge generation layer (CGL3) 880 disposed between the third and fourth emitting parts 800B and 900.

In the OLED D4, two of the first to fourth emitting parts 600A, 700B, 800B and 900 emits blue color light, another of the first to fourth emitting parts 600A, 700B, 800B and 900 emits green color light, and the rest of the first to fourth emitting parts 600A, 700B, 800B and 900 emits red color light, so that the OLED D4 can implement white (W) emission. Hereinafter, the OLED D4 where the first emitting part 600A emits red color light, the second and fourth emitting parts 700B and 900 emits blue color light and the third emitting part 800B emits green color light will be described in detail.

The first emitting part 600A includes a first emitting material layer (EML1) 640. The first emitting part 600A can include at least one of a hole injection layer (HIL) 610 disposed between the first electrode 510 and the EML1 640, a first hole transport layer (HTL1) 620 disposed between the HIL 610 and the EML1 640, and a first electron transport layer (ETL1) 660 disposed between the EML1 640 and the CGL1 680. Alternatively or additionally, the first emitting part 600A can further include a first electron blocking layer (EBL1) 630 disposed between the HTL1 620 and the EML1 640 and/or a first hole blocking layer (HBL1) 650 disposed between the EML1 640 and the ETL1 660.

The second emitting part 700B includes a second emitting material layer (EML2) 740. The second emitting part 700B can include at least one of a second hole transport layer (HTL2) 720 disposed between the CGL1 680 and the EML2 740 and a second electron transport layer (ETL2) 760 disposed between the EML2 740 and the CGL2 780. Alternatively or additionally, the second emitting part 700B can further include a second electron blocking layer (EBL2) 730 disposed between the HTL2 720 and the EML2 740 and/or a second hole blocking layer (HBL2) 750 disposed between the EML2 740 and the ETL2 760.

The third emitting part 800B includes a third emitting material layer (EML3) 840 and a charge control layer (CCL) 830 disposed between the CGL2 780 and the EML3 840. The third emitting part 800B can include at least one of a third hole transport layer (HTL3) 820 disposed between the CGL2 780 and the CCL 830 and a third electron transport layer (ETL3) 860 disposed between the EML3 840 and the CGL3 880. The HTL3 820 can be omitted. Alternatively or additionally, the third emitting part 800B can further include a third hole blocking layer (HBL3) 850 disposed between the EML3 840 and the ETL3 860.

The fourth emitting part 900 includes a fourth emitting material layer (EML4) 940. The fourth emitting part 900 can include at least one of a fourth hole transport layer (HTL4) 920 disposed between the CGL3 880 and the EML4 940, a fourth electron transport layer (ETL4) 960 disposed between the EML4 940 and the second electrode 520, and an electron injection layer (EIL) 970 disposed between the ETL4 960 and the second electrode 520. Alternatively or additionally, the fourth emitting part 900 can further include at least one of a third electron blocking layer (EBL3) 930 disposed between the HTL4 920 and the EML4 940 and a fourth hole blocking layer (HBL4) 950 disposed between the EML4 940 and the ETL4 960.

The materials in the OLED D4 can be identical to the corresponding materials with referring to FIGS. 6 and 7 otherwise described.

Each of the HTL1 620, the HTL2 720, the HTL3 820 and the HTL4 920 provides holes to the EML1 640, the EML2 740, the EML3 840 and the EML4 940, respectively. Each of the HTL1 620, the HTL2 720, the HTL3 820 and the HTL4 920 can include, but is not limited to, TPD, NPB (NPD), DNTPD, BPBPA, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and/or combination thereof. Alternatively or additionally, each of the HTL1 620, the HTL2 720, the HTL3 820 and the HTL4 920 can include, but is not limited to, an aryl amine-based compound with a spirofluorene moiety and/or a hetero aryl amine-based compound with a spirofluorene moiety as the second host 832 in the CCL 830.

Each of the ETL1 660, the ETL2 760, the ETL3 860 and the ETL4 960 transports electrons to each of the EML1 640, the EML2 740, the EML3 840 and the EML4 940, respectively. As an example, each of the ETL1 660, the ETL2 760, the ETL3 860 and the ETL4 960 can include at least one of an oxadiazole-based compound, a triazole-based compound, a phenanthroline-based compound, a benzoxazole-based compound, a benzothiazole-based compound, a benzimidazole-based compound and a triazine-based compound.

For example, each of the ETL1 660, the ETL2 760, the ETL3 860 and the ETL4 960 can include, but is not limited to, $Alq_3$, PBD, spiro-PBD, Liq, TPBi, BAlq, Bphen, NBphen, BCP, TAZ, NTAZ, TpPyPB, TmPPPyTz, PFNBr, TPQ, TSPO1, ZADN and/or combinations thereof.

Each of the EBL1 630, the EBL2 730 and the EBL3 930 can independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP,CuPc, DNTPD, TDAPB, DCDPA, 2,8-bis(9-phenyl-9H-carbazol-3-yl)dibenzo[b,d]thiophene and/or combinations thereof, respectively.

Each of the HBL1 650, the HBL2 750, the HBL3 850 and the HBL4 950 can include, but is not limited to, at least one of an oxadiazole-based compound, a triazole-based compound, a phenanthroline-based compound, a benzoxazole-based compound, a benzothiazole-based compound, a benzimidazole-based compound, and a triazine-based compound. For example, each of the HBL1 650, the HBL2 750, the HBL3 850 and the HBL4 950 can independently include, but is not limited to, BCP, B Alq, $Alq_3$, PBD, spiro-PBD, Liq, B3PYMPM, DPEPO, 9-(6-(9H-carbazol-9-yl)pyridine-3-yl)-9H-3,9'-bicarbazole, TSPO1 and/or combinations thereof, respectively.

The CGL1 680 is disposed between the first emitting part 600A and the second emitting part 700B. The CGL1 680 includes a first N-type CGL (N-CGL1) 685 disposed adjacently to the first emitting part 600A and a first P-type CGL (P-CGL1) 690 disposed adjacently to the second emitting part 700B. The N-CGL1 685 injects electrons to the EML1 640 of the first emitting part 600A and the P-CGL1 690 injects holes to the EML2 740 of the second emitting part 700B.

The CGL2 780 is disposed between the second emitting part 700B and the third emitting part 800B. The CGL2 780 includes a second N-type CGL (N-CGL2) 785 disposed adjacently to the second emitting part 700B and a second P-type CGL (P-CGL2) 790 disposed adjacently to the third emitting part 800B. The N-CGL2 785 injects electrons to the EML2 740 of the second emitting part 700B and the P-CGL2 790 injects holes to the EML3 840 of the third emitting part 800B.

The CGL3 880 is disposed between the third emitting part 800B and the fourth emitting part 900. The CGL3 880 includes a third N-type CGL (N-CGL3) 885 disposed adjacently to the third emitting part 800B and a third P-type CGL (P-CGL3) 890 disposed adjacently to the fourth emitting part 900. The N-CGL3 885 injects electrons to the EML3 840 of the third emitting part 800B and the P-CGL3 890 injects holes to the EML4 940 of the fourth emitting part 900.

The materials included in each of the N-CGL1 685, the N-CGL2 785 and the N-CGL3 885 and the P-CGL1 690, the P-CGL2 790 and the P-CGL3 890 can be identical to the corresponding materials with referring to FIG. 6.

The EML1 640 can be a red EML. The EML1 640 can include a red host and a red emitter. The red emitter can include red phosphorescent material, red fluorescent material and/or red delayed fluorescent material. The red host and the red emitter can be identical to the corresponding material with referring to FIG. 6.

Each of the EML2 740 and the EML4 940 can be a blue EML. In this case, each of the EML2 740 and the EML4 940 can independently a blue EML, a sky-blue EML or a deep-blue EML. Each of the EML2 740 and the EML4 940 can include a blue host and a blue emitter. The blue host and the blue emitter can be identical to the corresponding materials with referring to FIG. 6. For example, the blue emitter can include at least one of blue phosphorescent material, blue fluorescent material and blue delayed fluorescent material. Alternatively or additionally, the blue host and/or the blue emitter in the EML2 740 can be different from the blue host and/or the blue emitter in the EML4 940 in terms of luminous color and luminous efficiency.

The EML3 840 can include a first host 842, which can be a P-type green host, and a green emitter 844. Alternatively or additionally, the EML3 840 can further include an N-type green host. The first host 842 including the P-type green host, and optionally the N-type green host, and the green emitter 844 can be identical to the corresponding materials with referring to FIGS. 3 and 4.

The CCL 830 includes a second host 832, which can be an aryl amine-based compound with a spirofluorene moiety and/or a hetero aryl amine-based compound with a spirofluorene moiety, and a dopant 834 having maximum luminescence peak in the wavelength range longer than the maximum luminescence wavelength of the green emitter 844. The second host 832 and the dopant 834 can be identical to the corresponding material with referring to FIGS. 3 and 4. The LUMO energy levels, HOMO energy levels and hole mobilities of the organic layer in the third emitting part 800B can be identical to the corresponding energy levels and hole mobilities with referring to FIG. 4.

For example, the LUMO energy level of the second host 832 in the CCL 830 can be equal to or lower than the LUMO energy level of the first host 842, for example, the P-type green host, in the EML3 840. The LUMO energy level of the second host 832 and the LUMO energy level of the first host 842 can satisfy the relationship in Equation (1). The second host 832 can have hole mobility of three to ten times faster, for example, five to ten times faster, than the hole mobility of the first host 842, and of ten to fifty times faster, for example, ten to forty times faster, than the hole mobility of the hole transporting material in the HTL3 820.

The HOMO energy level of the second host 832 in the CCL 830 can be equal to or higher than the HOMO energy level of the first host 842, for example, the P-type green host, in the EML3 840. For example, the HOMO energy level of the second host 832 and the HOMO energy level of the first host 842 can satisfy the relationship in Equation (2).

Also, the LUMO energy level of the second host 832 in the CCL 830 can be equal to or higher than the LUMO energy level of the hole transporting material in the HTL3 820. For example, the LUMO energy level of the second host 832 and the LUMO energy level of the hole transporting material in the HTL3 820 can satisfy the relationship in Equation (3).

In addition, the HOMO energy level of the second host 832 in the CCL 830 can be equal to or higher than the HOMO energy level of the hole transporting material in the HTL3 820. For example, the HOMO energy level of the second host 832 and the HOMO energy level of the hole transporting material in the HTL3 820 can satisfy the relationship in Equation (4).

The LUMO energy levels, the HOMO energy levels and hole mobilities of the first host 842 in the EML3 840 as the green EML, the second host 832 in the CCL 830 and the hole transporting material in the HTL3 820 are adjusted. It is possible to minimize charge accumulations at the interface between the EML3 840 and the adjacently-disposed charge transport layer and prevent material from being deteriorated owing to holes by adjusting hole mobility and an amount of hole injection to the EML3 840. In addition, it is possible to improve the stability of the HTL3 820 because electrons injected into the EML3 840 from the ETL3 860 are trapped in the CCL 830, and thereby improving the luminous lifespan of the OLED D4.

In addition, the OLED D4 emitting white color light does not include yellow-green EML. Accordingly, the color purity of the emitting light in the OLED D4 can be improved and color gamut in the OLED D4 can be enhanced as the Color Reproduction Range such as BT2020 and DCT overlapping ratio is improved.

Implementation Example 1 (Ex.1): Fabrication of OLED

An organic light emitting diode with a tandem structure where a charge control layer is disposed between a hole transport layer and a green emitting material layer was fabricated.

A glass substrate onto which ITO (100 nm) was coated as a thin film was washed and ultrasonically cleaned by solvent such as isopropyl alcohol, acetone and dried at 100° C. oven. The substrate was transferred to a vacuum chamber for depositing emissive layer. Subsequently, an emissive layer and a cathode were deposited by evaporation from a heating boat under about 5-7×$10^{-7}$ Torr as the following order:

Blue emitting part: N-CGL1 (phenanthroline-based host doped with Li); P-CGL1 (aryl amine-based host with a spirofluorene moiety doped with a p-dopant, LUMO: −2.3 eV, HOMO: −5.64 eV); hole transport layer (HTL, hole transporting material of aryl amine-based compound with a spirofluorene moiety, LUMO: −2.6 eV, HOMO: −5.71 eV, 10 nm); charge control layer (CCL, aryl amine-based host with a spirofluorene moiety (LUMO: −2.3 eV, HOMO: −5.6 eV, 94 wt %), iridium-based red phosphorescent dopant (6 wt %), 5-20 nm); green emitting material layer (green host (mixed with carbazole-based P-type green host substituted with fused aromatic group (LUMO: −2.4 eV, HOMO: −5.72 eV) and an N-type green host (LUMO: −3.0 eV, HOMO: −6.1 eV) with a 1:1 by weight), iridium-based green phosphorescent emitter); electron transport layer (benzimidazole-based electron transporting material, LUMO: −3.11 eV, HOMO: −6.2 eV); N-CGL2 (phenanthroline-based host doped with Li, LUMO: −2.8 eV, HOMO: −6.06 eV); P-CGL2 (aryl amine-based host with a spirofluorene moiety, p-type dopant); red emitting part; cathode (Al).

The P-type green host used in the green emitting material layer has minimum hole mobility of 1.0E-06 $cm^2/Vs$ and maximum hole mobility of 1.0E04 $cm^2/Vs$, and the aryl amine-based host with a spirofluorene moiety used in the charge control layer has minimum hole mobility of 5.6E-06 cm2/Vs (5.6 times faster than the P-type green host) and maximum hole mobility of 4.3E-04 $cm^2/Vs$ (4.3 times faster than the P-type green host), in the same energy level. In addition, the aryl amine-based host used in the charge control layer has hole mobility of 4.3E-06 $cm^2/Vs$, ground state dipole moment of 0.618 C·m and excitation state dipole moment of 2.463 C·m in the same energy level. The hole transporting material used in the hole transport layer has hole mobility of 1.00E-05 to 3.10E-05 $cm^2/Vs$, ground state dipole moment of 0.771 to 1.522 C·m and excitation state dipole moment of 10.837 (or 10.831) C·m.

Implementation Example 2 (Ex. 2): Fabrication of OLEDs

An OLED can be fabricated using the same procedure and the same material as Example 1, except that the charge control layer has a thickness of 15~30 nm.

Implementation Examples 3-4 (Ex. 3-4): Fabrication of OLEDs

An OLED can be fabricated using the same procedure and the same material as Example 1, except that the contents of the iridium-based red phosphorescent dopant in the charge control layer were changed to 10 wt % (Example 3) or 20 wt % (Example 4).

Comparative Examples 1 (Ref. 1): Fabrication of OLED

An OLED was fabricated using the same procedure and the same material as Example 1, except the charge control layer was not formed and the hole transport layer has a thickness of 15~20 nm.

Comparative Example 2 (Ref. 2): Fabrication of OLED

An OLED was fabricated using the same procedure and the same material as Example 1, except that an aryl amine-based compound with a spirofluorene moiety, as a host in the charge control layer of the green emitting part, of which LUMO energy level is higher than the LUMO energy level of the P-type green host.

Experimental Example 1: Measurement of Luminous Properties of OLEDs

The luminous properties for each of the OLEDs, fabricated in Examples 1 to 4 and Comparative Examples 1 to 2, were measured. Based on the properties of the OLED fabricated in Comparative Example 1, full current density (cd/A at full), color coordinates, and driving voltage (V), EQE, luminous lifetime of green light, Color Reproduction Range (CRR) and color overlapping ratio at 10 mA/$cm^2$ of current density were measured. Table 1 and FIGS. 9 to 13 indicate the measurement results.

TABLE 1

Luminous Properties of OLED

| Measurement | | Ref. 1 | Ref. 2 | Ex. 1 | Ex. 2 | Ex. 3 | Ex. 4 |
|---|---|---|---|---|---|---|---|
| cd/A | R | 100% | — | 140% | 171% | 116% | 116% |
| | G | 100% | — | 87% | 86% | 99% | 95% |
| | B | 100% | — | 97% | 97% | 100% | 99% |
| | W | 100% | — | 89% | 91% | 102% | 99% |
| color | Rx | 0.00 | — | 0.02 | 0.02 | 0.00 | 0.00 |
| coor- | Ry | 0.00 | — | −0.01 | −0.01 | 0.00 | 0.00 |
| dinates | Gx | 0.00 | 0.01 | 0.00 | 0.00 | 0.01 | 0.01 |
| | Gy | 0.00 | −0.01 | 0.00 | 0.00 | 0.00 | 0.00 |
| | Bx | 0.00 | — | 0.00 | 0.00 | 0.00 | 0.00 |
| | By | 0.00 | — | 0.00 | 0.00 | 0.00 | 0.00 |
| | Wx | 0.00 | — | 0.00 | 0.01 | 0.01 | 0.01 |
| | Wy | 0.00 | — | −0.02 | −0.02 | 0.00 | −0.01 |
| Driving voltage V) | | 0.00 | 0.14 | 0.06 | 0.13 | 0.20 | 0.20 |
| EQE | | 100% | 97% | 97% | 101% | 103% | 101% |
| lifespan (green) | | 100% | 105% | 116% | 111% | 105% | 148% |
| CRR | BT2020 | 100% | 100% | — | — | — | 101% |
| Over-lapping ratio | DCI | 100% | 100% | — | — | — | 101% |

As indicated in Table 1 and FIGS. 9-13, compared to the OLED fabricated in Comparative Example 1 without the charge control layer and the OLED fabricated in Comparative Example 2 where the host having LUMO energy level higher than the LUMO energy level of the green P-type host in the green emitting material layer was used in the charge control layer, in the OLEDs fabricated in Examples 1-4 where the host having LUMO energy level lower than the LUMO energy level of the green P-type host in the green emitting material layer was used in the charge control layer, luminous efficiency in the red area was improved and the luminous lifespan of the green light was increased significantly. In addition, in the OLEDs fabricated in Examples 1-4, color gamut such as Color Reproduction Range and overlapping ratio was expanded and color purity was improved.

It will be apparent to those skilled in the art that various modifications and variations may be made in the present disclosure without departing from the scope of the disclosure. Thus, it is intended that the present disclosure cover the modifications and variations of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode including:

a first electrode;

a second electrode facing the first electrode; and an emissive layer disposed between the first electrode and the second electrode, and including at least one emitting part, wherein an emitting part of the at least one emitting part includes:

a green emitting material layer including a first host and a green emitter; and a charge control layer disposed between the first electrode and the green emitting material layer, and including a second host and a dopant that has a maximum luminescence peak in a wavelength range longer than a maximum luminescence peak of the green emitter, and wherein the second host has a lowest unoccupied molecular orbital (LUMO) energy level lower than a LUMO energy level of the first host.

2. The organic light emitting diode of claim 1, wherein the second host has a hole mobility about three to ten times faster than a hole mobility of the first host.

3. The organic light emitting diode of claim 1, wherein the first host includes a carbazole-based organic compound.

4. The organic light emitting diode of claim 1, wherein the green emitter includes an organometallic compound that has a maximum luminescence peak in a green wavelength range.

5. The organic light emitting diode of claim 1, wherein the second host includes an aryl amine-based organic compound with a spirofluorene moiety or a hetero aryl amine-based organic compound with a spirofluorene moiety.

6. The organic light emitting diode of claim 1, wherein the dopant includes an organometallic compound that has a maximum luminescence peak in a red wavelength range or a yellow green wavelength range.

7. The organic light emitting diode of claim 1, wherein a doping concentration of the dopant in the charge control layer is in a range from about 1 wt % to about 30 wt %, inclusive.

8. The organic light emitting diode of claim 1, wherein the LUMO energy level of the second host and the LUMO energy level of the first host satisfy an equation:

$$-0.3\text{ eV}\leq LUMO^{CCL}-LUMO^{EML}<0\text{ eV},$$

wherein, $LUMO^{CCL}$ indicates a LUMO energy level of the second host and $LUMO^{EML}$ indicates a LUMO energy level of the first host.

9. The organic light emitting diode of claim 1, wherein the second host has a highest occupied molecular orbital (HOMO) energy level equal to or higher than a HOMO energy level of the first host.

10. The organic light emitting diode of claim 9, wherein the HOMO energy level of the second host and the HOMO energy level of the first host satisfy an equation:

$$0\text{ eV}<HOMO^{CCL}-HOMO^{EML}\leq 0.3\text{ eV},$$

wherein, $HOMO^{CCL}$ indicates a HOMO energy level of the second host and $HOMO^{EML}$ indicates a HOMO energy level of the first host.

11. The organic light emitting diode of claim 1, wherein the emitting part of the at least one emitting part further includes a hole transport layer disposed between the first electrode and the charge control layer.

12. The organic light emitting diode of claim 11, wherein a LUMO energy level of the second host is equal to or higher than a LUMO energy level of a hole transporting material in the hole transport layer.

13. The organic light emitting diode of claim 11, wherein a LUMO energy level of the second host and a LUMO energy level of a hole transporting material in the hole transport layer satisfy an equation:

$$0\text{ eV}\leq LUMO^{CCL}-LUMO^{HTL}<0.5\text{ eV},$$

wherein, $LUMO^{CCL}$ indicates the LUMO energy level of the second host and $LUMO^{HTL}$ indicates the LUMO energy level of the hole transporting material.

14. The organic light emitting diode of claim 11, wherein a HOMO energy level of the second host is equal to or higher than a HOMO energy level of a hole transporting material in the hole transport layer.

15. The organic light emitting diode of claim 11, wherein a HOMO energy level of the second host and a HOMO energy level of a hole transporting material in the hole transport layer satisfy an equation:

$$0\text{ eV}<HOMO^{CCL}-HOMO^{HTL}\leq 0.3\text{ eV},$$

wherein, $HOMO^{CCL}$ indicates the HOMO energy level of the second host and $HOMO^{HTL}$ indicates the HOMO energy level of the hole transporting material.

16. The organic light emitting diode of claim 11, wherein the second host has a hole mobility about ten to fifty times faster than a hole mobility of a hole transporting material in the hole transport layer.

17. The organic light emitting diode of claim 1, wherein the emissive layer has a single emitting part.

18. The organic light emitting diode of claim 1, wherein the emissive layer includes:

a first emitting part disposed between the first and second electrodes;

a second emitting part disposed between the first emitting part and the second electrode; and a first charge generation layer disposed between the first and second emitting parts, and wherein one of the first emitting part or the second emitting part is the emitting part that includes the green emitting material layer and the charge control layer.

19. The organic light emitting diode of claim 18, wherein the second emitting part is the emitting part that includes the green emitting material layer and the charge control layer.

20. The organic light emitting diode of claim 19, wherein the second emitting part includes an emitting material layer disposed between the first charge generation layer and the second electrode, and wherein the emitting material layer includes:

a first layer disposed between the charge control layer and the second electrode; and a second layer disposed between the first layer and the second electrode, and wherein one of the first layer or the second layer includes the green emitting material layer and another one of the first layer or the second layer includes a red emitting material layer.

21. The organic light emitting diode of claim 20, wherein the first emitting part includes a blue emitting material layer.

22. The organic light emitting diode of claim 1, wherein the emissive layer includes:

a first emitting part disposed between the first and second electrodes;

a second emitting part disposed between the first emitting part and the second electrode;

a third emitting part disposed between the second emitting part and the second electrode;

a first charge generation layer disposed between the first and second emitting parts; and a second charge generation layer disposed between the second and third emitting parts, and wherein at least one of the first emitting part, the second emitting part or the third emitting part is the emitting part that includes the green emitting material layer and the charge control layer.

23. The organic light emitting diode of claim 22, wherein the second emitting part is the emitting part that includes the green emitting material layer and the charge control layer.

24. The organic light emitting diode of claim 23, wherein the second emitting part includes an emitting material layer disposed between the first charge generation layer and the second charge generation layer, wherein the emitting material layer includes:

a first layer disposed between the charge control layer and the second charge generation layer; and a second layer disposed between the first layer and the second charge generation layer, and wherein one of the first layer or the second layer includes the green emitting material layer and the charge control layer.

25. The organic light emitting diode of claim 24, wherein each of the first emitting part and the third emitting part includes a blue emitting material layer.

26. The organic light emitting diode of claim 1, wherein the emissive layer includes:

a first emitting part disposed between the first and second electrodes;

a second emitting part disposed between the first emitting part and the second electrode;

a third emitting part disposed between the second emitting part and the second electrode;

a fourth emitting part disposed between the third emitting part and the second electrode;

a first charge generation layer disposed between the first and second emitting parts;

a second charge generation layer disposed between the second and third emitting parts; and a third charge generation layer disposed between the third and fourth emitting parts, and wherein at least one of the first emitting part, the second emitting part, the third emitting part or the fourth emitting part is the emitting part that includes the green emitting material layer and the charge control layer.

27. The organic light emitting diode of claim 26, wherein the third emitting part is the emitting part that includes the green emitting material layer and the charge control layer.

28. The organic light emitting diode of claim 26, wherein the first emitting part includes a red emitting material layer.

29. The organic light emitting diode of claim 26, wherein each of the second emitting part and the fourth emitting part includes a blue emitting material layer.

30. An organic light emitting device including:

a substrate; and an organic light emitting diode disposed over the substrate, the organic light emitting diode including:

a first electrode;

a second electrode facing the first electrode; and an emissive layer disposed between the first electrode and the second electrode, and including at least one emitting part, wherein an emitting part of the at least one emitting part includes:

a green emitting material layer including a first host and a green emitter; and a charge control layer disposed between the first electrode and the green emitting material layer, and including a second host and a dopant that has a maximum luminescence peak in a wavelength range longer than a maximum luminescence peak of the green emitter, and wherein the second host has a lowest unoccupied molecular orbital (LUMO) energy level lower than a LUMO energy level of the first host.

31. An organic light emitting diode including:

a first electrode and a second electrode; and an emissive layer disposed between the first electrode and the second electrode, and including:

a color emitting layer including a first host and a color emitter; and a charge control layer disposed between the first electrode and the color emitting layer, and including a second host and a dopant, the dopant having a maximum luminescence peak in a wavelength range not overlapping with a maximum luminescence peak of the color emitter, and the second host having a hole mobility different from a hole mobility of the first host.

32. The organic light emitting diode of claim 31, wherein the color emitter is a green emitter and the dopant includes an organometallic compound that has a maximum luminescence peak in a red wavelength range or a yellow green wavelength range.

* * * * *